US012599034B2

(12) United States Patent
Deshpande et al.

(10) Patent No.: US 12,599,034 B2
(45) Date of Patent: Apr. 7, 2026

(54) MICROELECTRONIC STRUCTURE INCLUDING ACTIVE BASE SUBSTRATE WITH THROUGH VIAS BETWEEN A TOP DIE AND A BOTTOM DIE SUPPORTED ON AN INTERPOSER

(71) Applicant: Intel Corporation, Santa Clara, CA (US)

(72) Inventors: Nitin A. Deshpande, Chandler, AZ (US); Omkar G. Karhade, Chandler, AZ (US); Mohit Bhatia, Chandler, AZ (US); Debendra Mallik, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 874 days.

(21) Appl. No.: 17/699,028

(22) Filed: Mar. 18, 2022

(65) Prior Publication Data

US 2023/0299049 A1 Sep. 21, 2023

(51) Int. Cl.
*H01L 25/065* (2023.01)
*H01L 21/56* (2006.01)
(Continued)

(52) U.S. Cl.
CPC ........ *H01L 25/0657* (2013.01); *H01L 21/565* (2013.01); *H01L 21/76898* (2013.01); *H01L 23/3128* (2013.01); *H01L 23/481* (2013.01); *H01L 23/49816* (2013.01); *H01L 23/49827* (2013.01); *H01L 24/16* (2013.01); *H01L 24/32* (2013.01); *H01L 25/50* (2013.01); *H01L 2224/0401* (2013.01);
(Continued)

(58) Field of Classification Search
CPC .............. H01L 25/0657; H01L 23/481; H01L 21/76898
See application file for complete search history.

(56) References Cited

U.S. PATENT DOCUMENTS

| | | |
|---|---|---|
| 2009/0294899 A1 | 12/2009 | Pagaila et al. |
| 2010/0081232 A1* | 4/2010 | Furman ................. H01L 21/768 438/618 |

(Continued)

OTHER PUBLICATIONS

PCT International Search Report and Written Opinion issued in PCT/US2023/062868, dated Jun. 13, 2023; 10 pages.
(Continued)

*Primary Examiner* — Dale E Page
*Assistant Examiner* — Wilner Jean Baptiste
(74) *Attorney, Agent, or Firm* — Alliance IP, LLC

(57) ABSTRACT

A microelectronic component and a method of forming same. The microelectronic component includes: a first substrate having first through vias therein, the first substrate including silicon or glass; a first layer on a front surface of the first substrate and including one or more first dies coupled to the first through vias; a second substrate on a front surface of first layer and having second through vias therein and including silicon or glass; a second layer on a front surface of the second substrate, the first layer between the first substrate and the second substrate, the second layer including one or more second dies coupled to the second through vias; and electrically conductive structures on a back surface of the first substrate coupled to the first through vias.

30 Claims, 12 Drawing Sheets

(51) Int. Cl.

| | | |
|---|---|---|
| *H01L 21/768* | (2006.01) | |
| *H01L 23/00* | (2006.01) | |
| *H01L 23/31* | (2006.01) | |
| *H01L 23/48* | (2006.01) | |
| *H01L 23/498* | (2006.01) | |
| *H01L 25/00* | (2006.01) | |

(52) U.S. Cl.
CPC .............. *H01L 2224/16145* (2013.01); *H01L 2224/16225* (2013.01); *H01L 2224/32225* (2013.01); *H01L 2225/06513* (2013.01); *H01L 2225/06541* (2013.01)

(56) References Cited

U.S. PATENT DOCUMENTS

| | | | |
|---|---|---|---|
| 2010/0187670 | A1* | 7/2010 | Lin ..................... H01L 23/3677 |
| | | | 257/E23.101 |
| 2015/0249065 | A1 | 9/2015 | Pagaila |
| 2021/0305173 | A1 | 9/2021 | Huang et al. |
| 2021/0375768 | A1 | 12/2021 | Tsou et al. |
| 2021/0398891 | A1 | 12/2021 | Rho et al. |
| 2021/0407920 | A1 | 12/2021 | Chen et al. |

OTHER PUBLICATIONS

Atanasov, Sarah E., et al. "Highly conductive and conformal poly (3, 4-ethylenedioxythiophene)(PEDOT) thin films via oxidative molecular layer deposition." Chemistry of Materials 26.11 (Mar. 2014): 3471-3478.

Augustyn, Piotr, et al. "A review on the direct electroplating of polymeric materials." Journal of Materials Science 56.27 (Jun. 2021): 14881-14899.

De Leeuw, Dago M., et al. "Electroplating of conductive polymers for the metallization of insulators." Jun. 1994; Synthetic metals 66.3 (1994): 263-273.

Gharahcheshmeh, Meysam Heydari, et al. "Tuning, optimization, and perovskite solar cell device integration of ultrathin poly (3, 4-ethylene dioxythiophene) films via a single-step all-dry process." Science advances 5.11 (Nov. 2019): eaay0414.

Kaviani, Shayan, et al. "An Organic Polymer with a Bifunctional Electrocatalytic Activity in Oxygen Reactions." (Nov. 2020) Available at SSRN 3733159.

Li, Jiujuan, et al. "Direct activation of copper electroplating on conductive composite of polythiophene surface-coated with nickel nanoparticles." Composites Part B: Engineering, Aug. 2018; 154 (2018): 257-262.

Nejati, Siamak, et al. "Enhanced charge storage of ultrathin polythiophene films within porous nanostructures." ACS nano 8.6 (May 2014): 5413-5422.

Prokop, J., "Manufacturing process for high aspect ration metallic micro parts made by electroplating on partially conductive templates." Microsystem technologies 14.9 (Jan. 2008): 1669-1674.

Wang, Xiaoxue, et al. "High electrical conductivity and carrier mobility in oCVD PEDOT thin films by engineered crystallization and acid treatment." Science advances 4.9 (Sep. 2018): eaat5780.

* cited by examiner

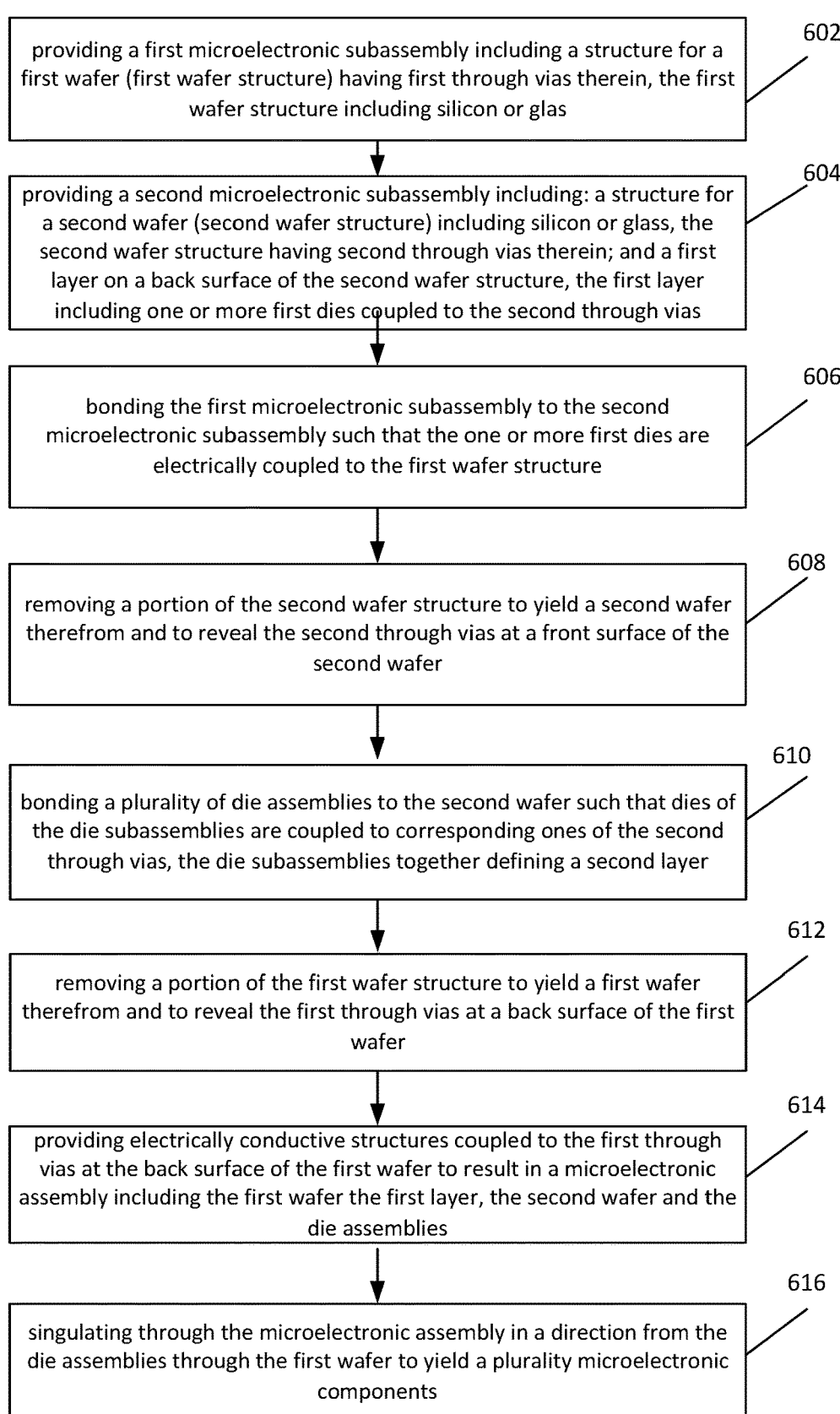

providing a first microelectronic subassembly including a structure for a first wafer (first wafer structure) having first through vias therein, the first wafer structure including silicon or glas                                                    602 providing a second microelectronic subassembly including: a structure for a second wafer (second wafer structure) including silicon or glass, the second wafer structure having second through vias therein; and a first layer on a back surface of the second wafer structure, the first layer including one or more first dies coupled to the second through vias                    604 bonding the first microelectronic subassembly to the second microelectronic subassembly such that the one or more first dies are electrically coupled to the first wafer structure                                              606 removing a portion of the second wafer structure to yield a second wafer therefrom and to reveal the second through vias at a front surface of the second wafer                                                               608 bonding a plurality of die assemblies to the second wafer such that dies of the die subassemblies are coupled to corresponding ones of the second through vias, the die subassemblies together defining a second layer          610 removing a portion of the first wafer structure to yield a first wafer therefrom and to reveal the first through vias at a back surface of the first wafer                                                                     612 providing electrically conductive structures coupled to the first through vias at the back surface of the first wafer to result in a microelectronic assembly including the first wafer the first layer, the second wafer and the die assemblies                                                                 614 singulating through the microelectronic assembly in a direction from the die assemblies through the first wafer to yield a plurality microelectronic components                                                               616

FIG. 6

MICROELECTRONIC STRUCTURE INCLUDING ACTIVE BASE SUBSTRATE WITH THROUGH VIAS BETWEEN A TOP DIE AND A BOTTOM DIE SUPPORTED ON AN INTERPOSER

TECHNICAL FIELD

This disclosure relates generally to deposition in trenches defined within a core substrate of a microelectronic structure.

BACKGROUND

A face to back process flow where the face of a top set of one or more dies is electrically and mechanically coupled to the backside of a bottom set of one or more dies requires ever tighter through via (such as through silicon via or TSV or through glass via or TGV) pitches for the die to die coupling. However, tight pitch TSVs/TGVs are challenging, in that they require the top set of one or more dies (furthest from the supporting package substrate) to have a thickness that is relatively small (e.g. less than about 50 μm), in order to accommodate the smaller pitches and smaller TSVs/ TGVs.

The state of the art, to overcome the challenge and achieve smaller TSVs/TGVs and tighter pitches, uses a method including processing a base wafer supporting dies thereon while the base wafer is fixed to a temporary carrier by a glue layer, and removing the temporary carrier after die to die bonding is complete. Otherwise, the TSVs/TGVs of the prior art and their pitches can be relatively large (at least 20 μm).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 6 is a flow chart of a process according to some embodiments.

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figures 1A, 1B:
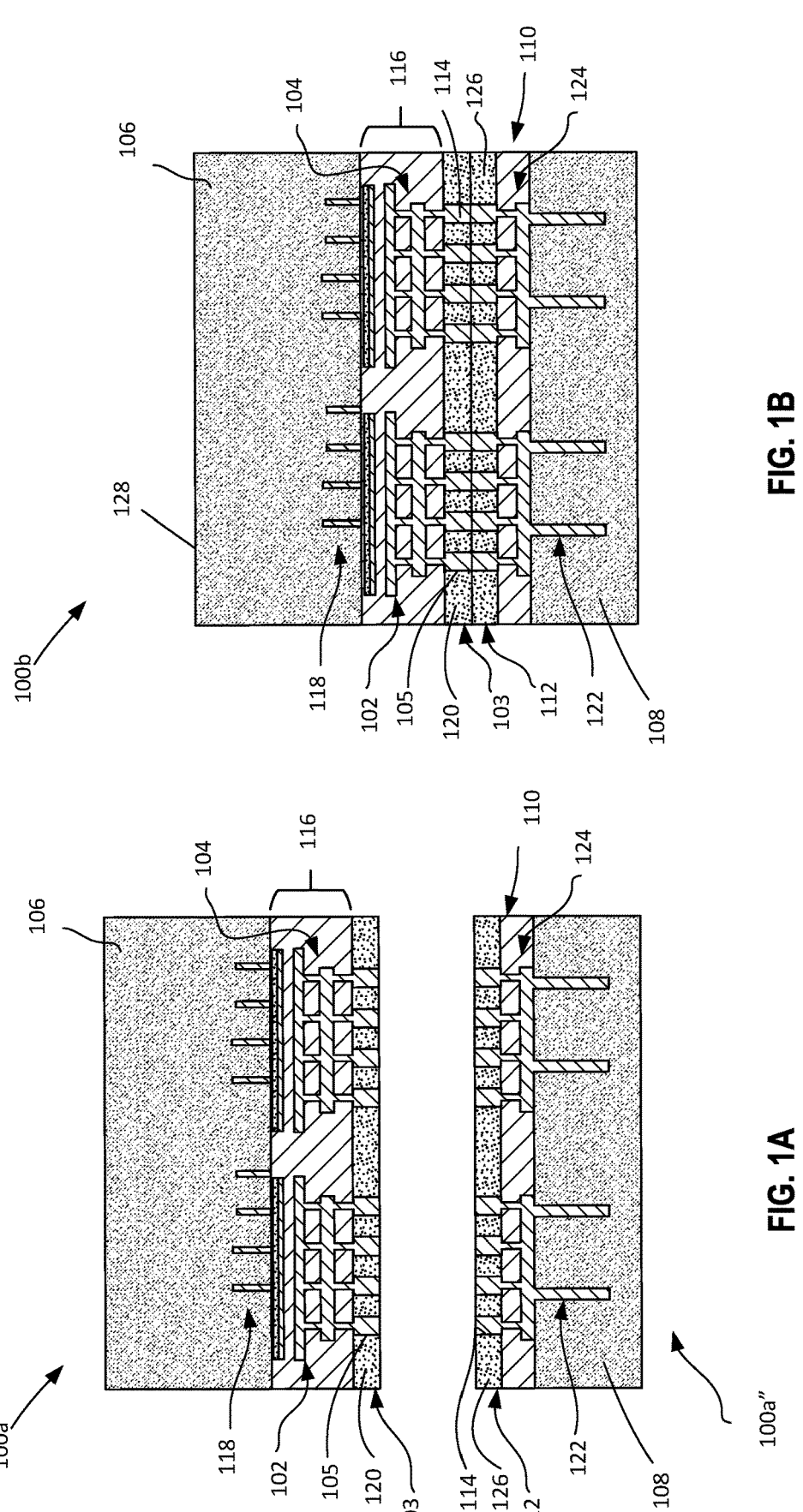
FIG. 1A is a cross section of a first microelectronic subcomponent including dies supported on a base wafer in the process of being bonded to a second microelectronic subcomponent including pads supported on an interposer wafer according to an embodiment.
FIG. 1B is a cross sectional view of a temporary microelectronic subassembly formed from a bonding of the microelectronic subcomponents of FIG. 1A to each other.

Some embodiments provide a microelectronic component that includes a stack of dies electrically and mechanically coupled to one another, where the stack comprises a passive interposer substrate having through vias therein, a first layer on a front surface of the interposer substrate, the first layer including one or more dies coupled to the through vias of the interposer substrate, a base substrate on the first layer, the base substrate including through vias therein, a second layer on the front surface of the base substrate, the second layer including one or more dies coupled to the through vias of the base substrate.

The interposer substrate may serve as a carrier substrate that is indirectly bonded to the base substrate by way of hybrid bonding of the one or more dies of the first layer (to which the base substrate is electrically and mechanically coupled) with interconnects of a redistribution layer disposed on the interposer substrate.

Hybrid bonding is a process involving direct metal to metal and dielectric to dielectric bonding between two microelectronic components. In hybrid bonding the metallic bonds and dielectric bonds may occur without the use of solder materials, and there may be an absence of underfill materials, solder materials.

According to one embodiment, the base substrate has thin through vias (e.g. with diameters of about 2 μm to about 10 μm) that are short (e.g. lengths below about 50 μm, for example about 5 μm to about 50 μm) at tight pitches (e.g. submicron to about 20 μm). According to an embodiment, where the pitch is less than or equal to 2 μm, the through via diameter is about ½ of the pitch, and where the pitch is above 2 μm, the diameter is between about 5 μm and 10 μm. During fabrication, in order to expose the through vias of the base substrate, a corresponding base wafer including the through vias therein may undergo grinding. Thereafter, a redistribution and bonding layer may be provided thereon.

The dies of the first layer may be hybrid bonded to interconnects of a redistribution layer on the interposer substrate, after which the through vias of the interposer substrate may be in turn revealed for subsequent bumping and attachment to a package substrate.

As noted previously, face to back process flows involving the stacking of layers of dies becomes more challenging as devices scale, with the requirement that through vias and via pitches be ever smaller. This is true for example where the dies within the layers to be stacked are chiplets. Tight pitch TSVs/TGVs are challenging, in that they require the second layer that includes the top set of one or more dies (further from the supporting package substrate) to have a thickness that is relatively small (e.g. less than about 50 μm) in order to accommodate the smaller pitches and smaller TSVs/TGVs.

The state of the art, to overcome the challenge and achieve smaller TSVs/TGVs and tighter pitches, uses a method including processing a base wafer supporting dies thereon while the base wafer is fixed to a temporary carrier by a glue layer, and removing the temporary carrier after die to die bonding is complete.

Where a thin second layer is used in the prior art, for example one having a thickness of less than about 50 μm in order to enable small through vias and fine pitches, the second layer would typically be mechanically too weak for the processing and handling required to achieve a microelectronic stack resulting from a face to back process flow. Thin base dies (dies in thin second layers of a stack) are prone to cracking after bonding to the underlying first layer of dies by virtue of stresses caused by the coefficient of thermal expansion mismatch between the package substrate supporting the stack on the one hand, and the dies in the second layer (top dies) supported by the dies in the first thin layer (bottom dies). Such stresses are more than an order of magnitude higher as compared to thicker first layers that include the bottom dies.

In addition, where a carrier layer is used in the prior art to carry the second layer of dies during face to back processing, a glue is typically used. However, organic glue materials are usually not compatible with high temperature processes associated with face to back process flows. Inorganic glue materials can be used for fusion bonding, but need, after processing, for the entire carrier wafer be ground back, which complicates the process flow.

Nevertheless, where a face to back architecture is used that includes thick and tall through vias in the second layer wastes transistor area that could have been used within the second layer in order to accommodate the larger through vias (e.g. having diameters above about 10 μm, lengths above about 50, and pitches above about 10 μm).

Embodiments provide a face to back process flow that obviates some of the processing of reliability risks of the prior art, such as the ones noted above.

Advantageously, some embodiments provide a face to back process flow where no thick fillers and chemical mechanical polishing of such fillers are needed for the base dies, where die crack risks for the second layer dies is lowered, where smaller through vias in the base substrate can be provided at finer pitches, and where a keep-out zone in the dies supported on the base substrate (dies in the second layer) can be smaller as a result of the smaller through vias and fine pitches.

By "die," what is meant herein is a block of semiconducting material on which a given functional circuit is fabricated. A "die" as used herein includes a "chiplet."

By "chiplet," what is meant herein is a type of die on which a sub processing unit, usually controlled by a I/O controller chip on the same package, is provided. The sub processing unit is to perform a subset of functionality, and is thus designed to be combined with other chiplets on an interposer in a single package.

By "wafer structure" or "wafer," what is meant herein is any supportive semiconductor layer that is not electrically conductive, and that supports or is to support microelectronic components thereon and/or therein, such as dies, passive components, stacks including dies and/or passive components, passive components, and the like, where the wafer is to be subjected to singulation to yield a "substrate."

By "trench," what is meant herein is any opening extending in a thickness direction of a semiconductor layer from one surface of the semiconductor layer to another surface of the layer.

By "through via," what is meant herein is any electrically conductive structure that has a largest dimension thereof extending through a semiconductor layer along a direction of a thickness of the semiconductor layer, the via being in a "trench" as defined herein.

Details of some embodiments will be described in further detail in relation to FIGS. 1A-1E, 2A-2E and 3A-3C below, after general remarks, in the immediate next few paragraphs, regarding the scope of the disclosure.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the instant detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized, and structural or logical changes may be made without departing from the scope of the present disclosure. Therefore, the following detailed description is not to be taken in a limiting sense, and the scope of embodiments is defined by the appended claims and their equivalents.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with passive heat spreaders, interface layers, TIMs, top dies, side dies, substrates, and package substrates.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

An explanation will now follow below regarding embodiments in the context of FIGS. 1A-1E, which show various stages in a process for forming a microelectronic assembly according to some embodiments. In particular, FIGS. 1A-1E show five stages in a first phase of a face to back process flow according to some embodiments. This first phase may be followed by a second phase, two different embodiments of which are shown, respectively, by way of FIGS. 2A-2E on the one hand, and FIGS. 3A-3C on the other hand.

FIGS. 1A-1E are meant to depict an embodiment where the shown processing takes place at a wafer level, although embodiments are not so limited. Thus, microelectronic subcomponent or subassembly shown in FIGS. 1A-1E is meant to represent only a portion of larger respective wafers including multiple dies thereon.

FIG. 1A shows a stage of fabrication of a microelectronic assembly according to some embodiments. In particular, FIG. 1A is a cross section, according to an embodiment, of a first microelectronic subcomponent 100*a'* including dies 102 and 104 in a die layer 101, and a bonding layer 103 including interconnects 105 supported on a base wafer structure 106, and of a second microelectronic subcomponent 100*a''* including an interposer structure 108 supporting a redistribution layer 110 and a bonding layer 112 thereon, where the bonding layer includes interconnects 114.

As used herein, an "interconnect" refers to any electrically conductive structure, such as, for example, contacts, pads, bumps, solder balls, etc. that allow the interconnection of one microelectronic component or subcomponent to another.

As used herein, a "bonding layer" refers to a layer of electrically non-conductive material, such as a dielectric, which includes interconnects embedded therein, where the interconnects serve to couple (electrically and mechanically)

the bonding layer to interconnects of another component. As used herein, "bonding layer" and "interconnect layer" are interchangeable.

As used herein, a "redistribution layer" refers to a layer of electrically non-conductive material, such as a dielectric, which includes electrically conductive traces to reroute connections to desired locations within the layer of electrically non-conductive material. For example, a bump array located in the center of a chip can be redistributed to positions near the chip edge using a redistribution layer. The ability to redistribute points can enable higher contact density and enable subsequent packaging steps.

Referring to the first microelectronic subcomponent 100*a'*, the dies 102 and 104 are included in a die layer 116. The base wafer structure 106 includes through vias 118 through a portion thereof. The bonding layer 103 includes a dielectric layer 120 within which interconnects 105 are embedded.

Referring to the second first microelectronic subcomponent 100*a''*, the interposer structure 108 includes through vias 122 extending through a portion thereof. Through vias 122 are electrically coupled to electrically conductive structures 124 of the redistribution layer 110. The bonding layer 112 includes a dielectric layer 126 within which interconnects 114 are embedded.

In FIG. 1A, first and second MSCs are being brought close together to allow hybrid bonding of interconnects 105 and 114 to one another in order to electrically and mechanically couple the first and second MSCs to each other.

FIG. 1B is a cross sectional view of a temporary microelectronic subassembly 100*b* formed from a hybrid bonding of the microelectronic subcomponents 100*a'* and 100*a''* of FIG. 1A to each other. The hybrid bonding shown in FIG. 1B results in the formation of a first layer, or bottom layer 116 that includes the redistribution layer 110, the bonding layer 112, the bonding layer 103, and the die layer 116. The first layer 127 is supported between the interposer structure and the base wafer structure 106. The base wafer structure 106 allows the further processing necessary for face to back connection of die layers without damage to the dies within die layer 116 by virtue of the interposer structure 108 and the base wafer structure 106 working together to impart mechanical stability to the subcomponents being processed.

"Temporary" as referred to in the context of a description of an element or structure as shown in FIGS. 1A-1E, 2A-2E and 3A-3C refers to a temporary configuration of that element or structure to the extent that it is to be modified in a next stage of the described process flow.

Figure 1C:
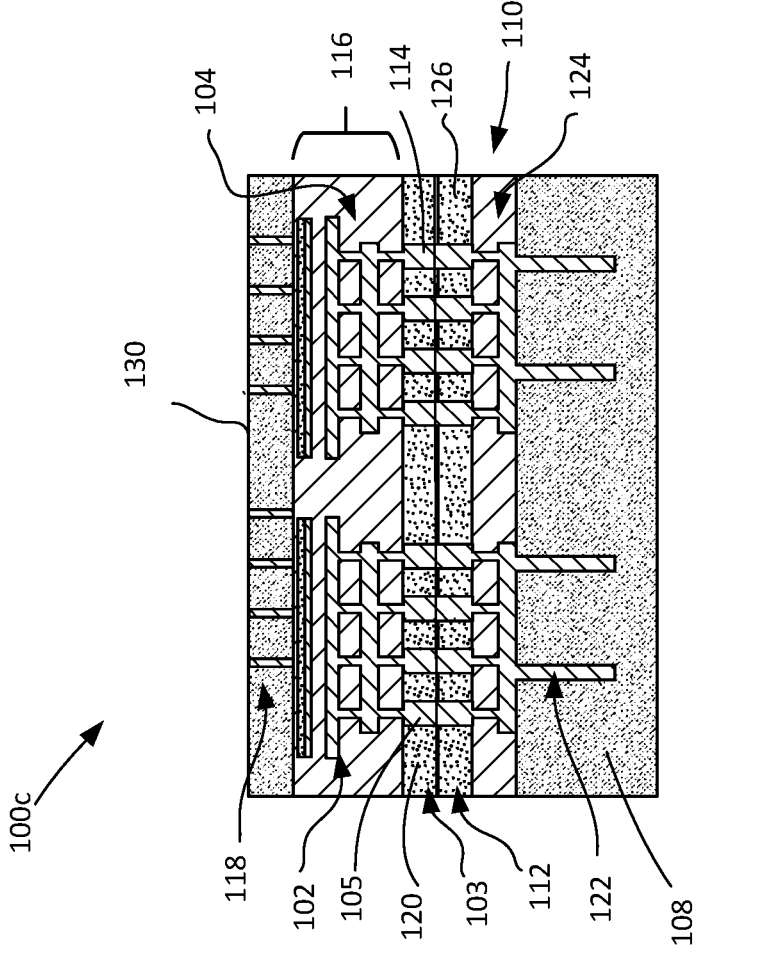
FIG. 1C is a cross sectional view of the temporary microelectronic subassembly of FIG. 1B after a through via reveal process.

FIG. 1C is a cross sectional view of the temporary microelectronic subassembly 100*b* of FIG. 1B after a through via reveal process on the base wafer structure to yield a temporary microelectronic subassembly 100*c*. In FIG. 1C, the TMSA 100*b* of FIG. 1B may be subjected to grinding at the back surface 128 thereof to expose or reveal through vias 118 and to form base wafer 130. Once singulated, the base wafer 130 would yield base substrates 131 as will be shown in FIGS. 2E, 3B and 3C.

Figure 2A:
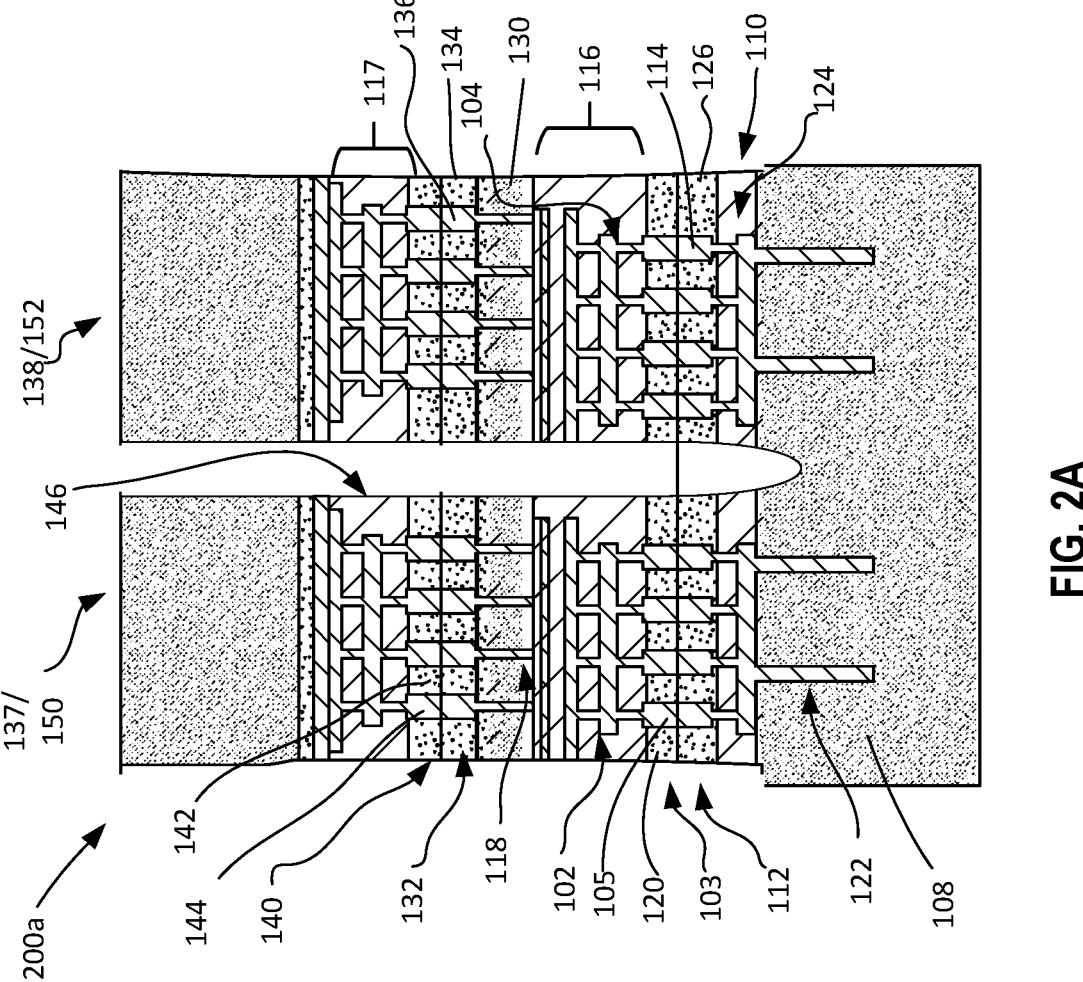
FIG. 2A is a cross section of the temporary microelectronic subassembly of FIG. 1E after having been subjected to material removal in a process to form a microelectronic assembly according to a first embodiment.
Figures 2B, 2C:
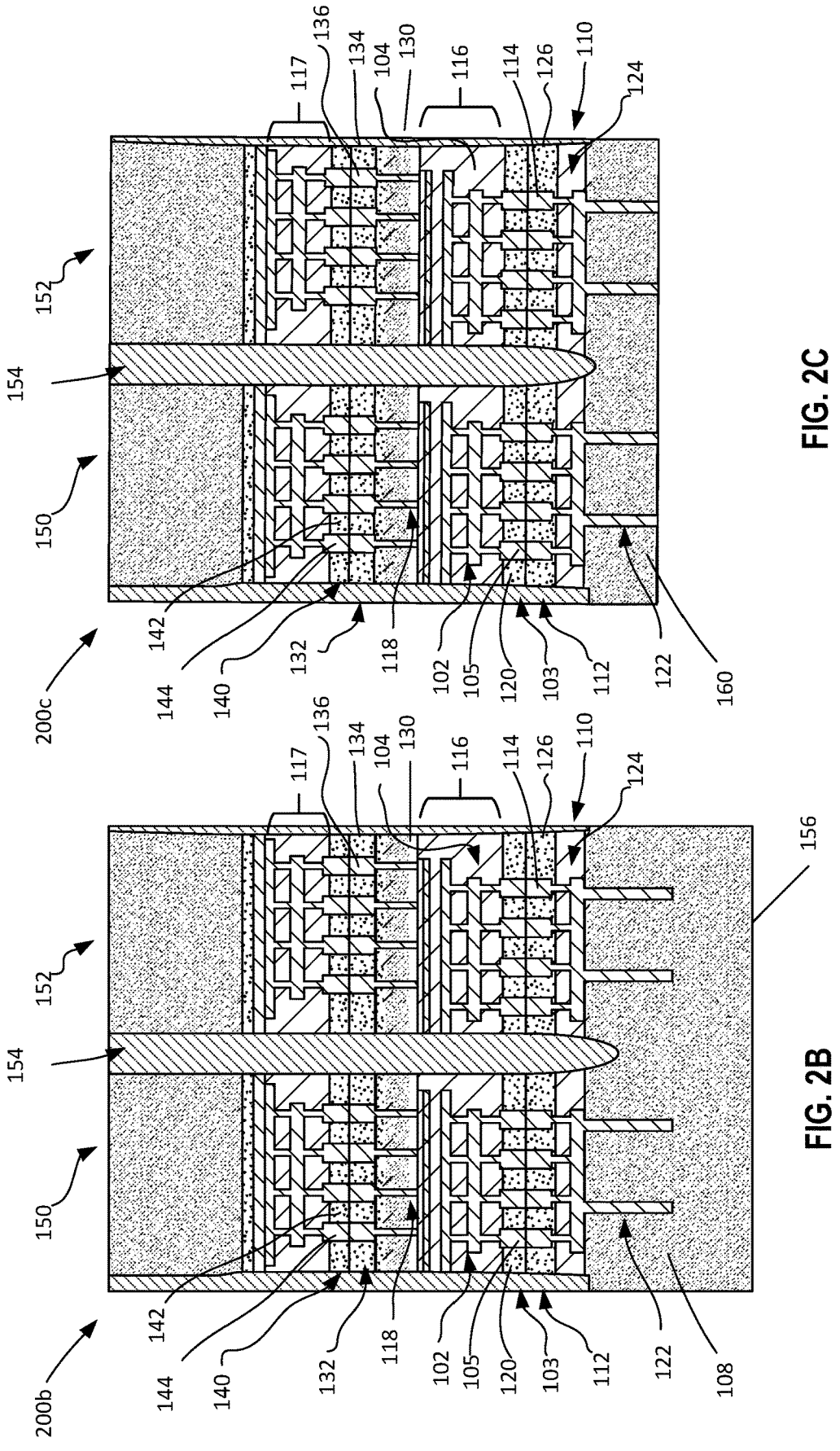
FIG. 2B is a cross sectional view of the temporary microelectronic subassembly of FIG. 2A after a molding and thinning process.
FIG. 2C is a cross sectional view of the temporary microelectronic subassembly of FIG. 2B after a through via reveal process on the interposer.
Figures 2D, 2E:
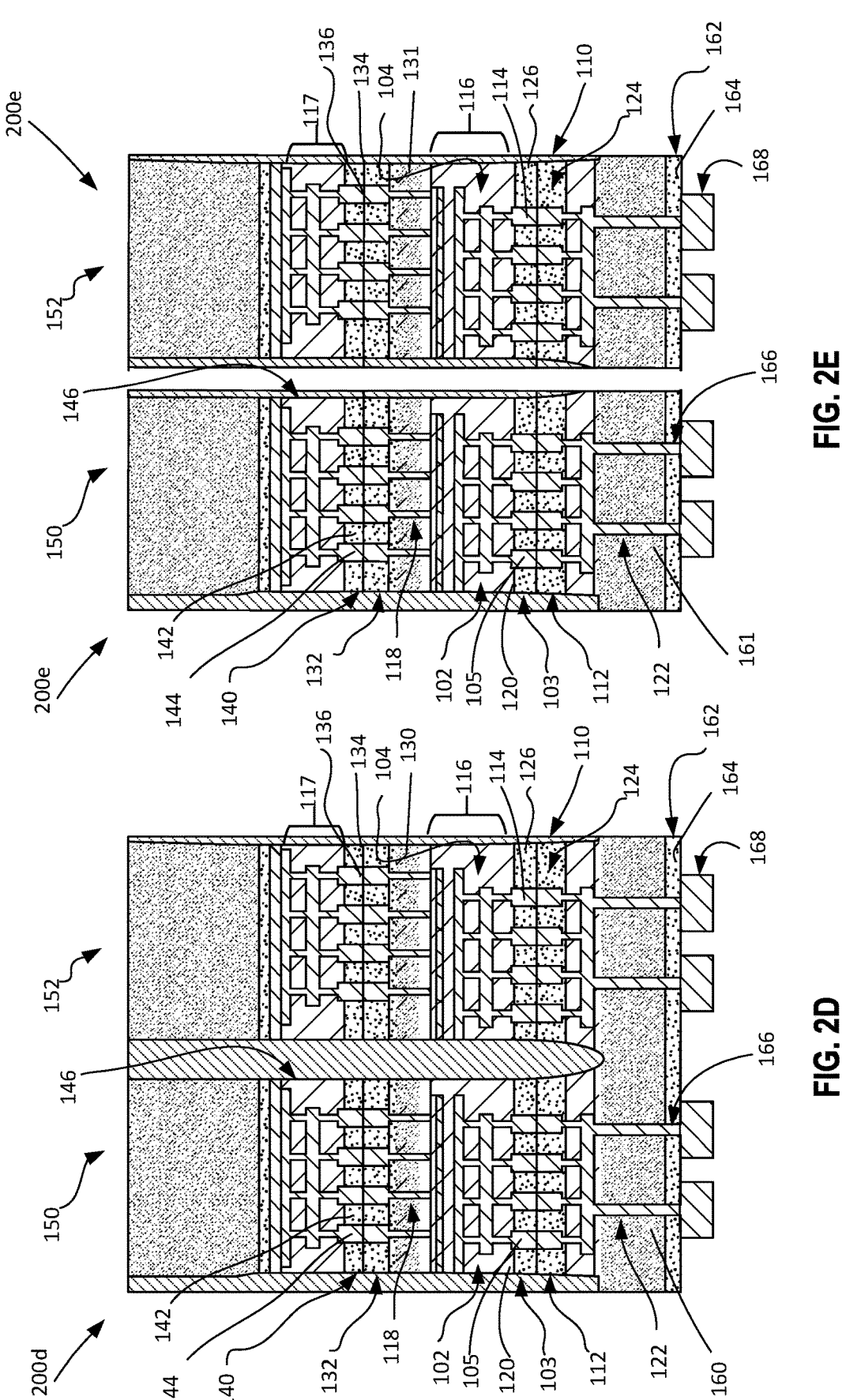
FIG. 2D is a cross-sectional view of the temporary microelectronic subassembly of FIG. 2C after provision of electrically conductive structures on the interposer.
FIG. 2E is cross sectional view of the temporary microelectronic subassembly of FIG. 2D after singulation into two microelectronic subassemblies.
Figure 3A:
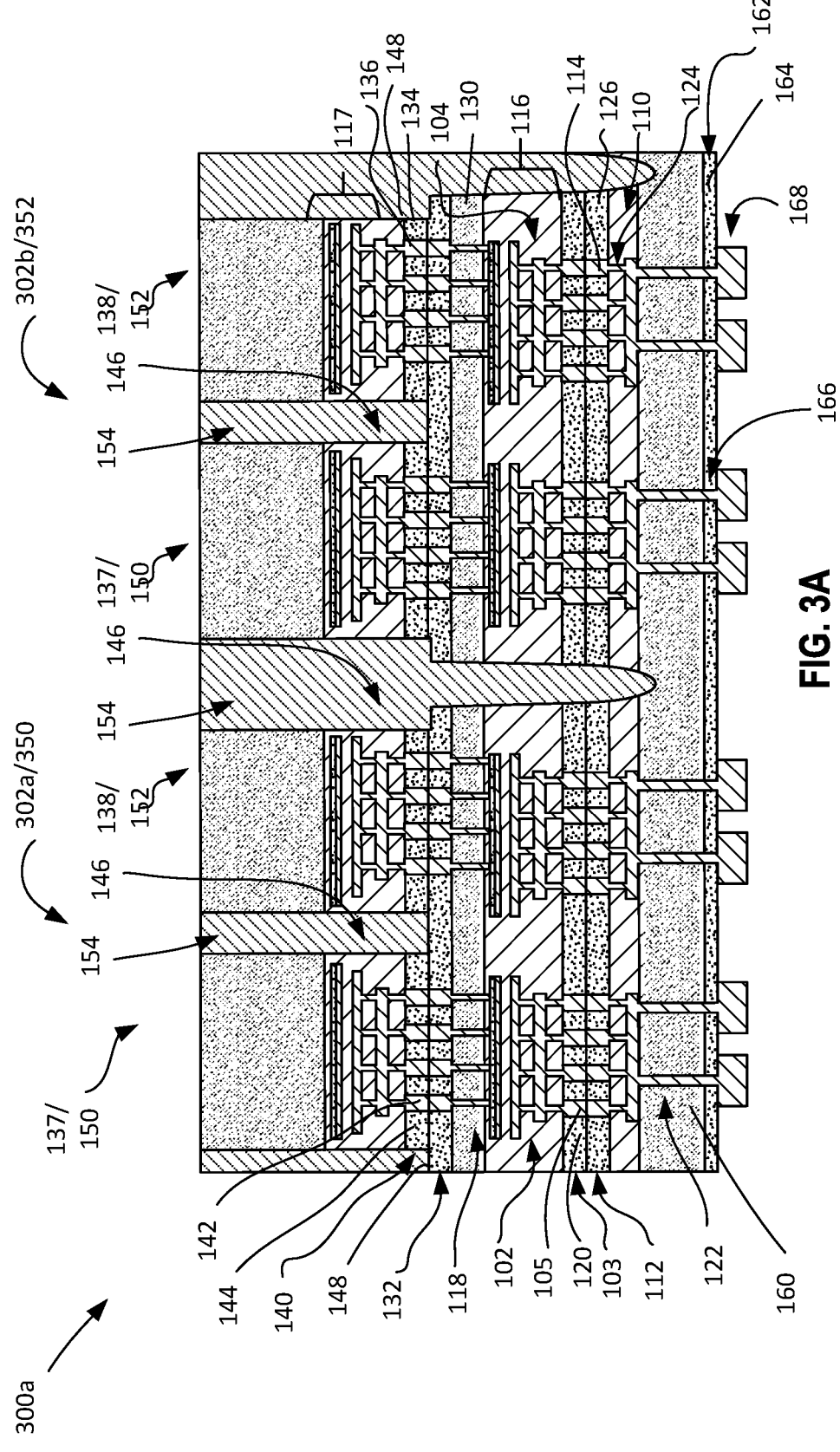
FIG. 3A is a cross-sectional view of a temporary microelectronic subassembly similar to that of FIG. 2D, but with each row of a stack of dies includes two dies in a process to form a microelectronic assembly according to a second embodiment.
Figure 3B:
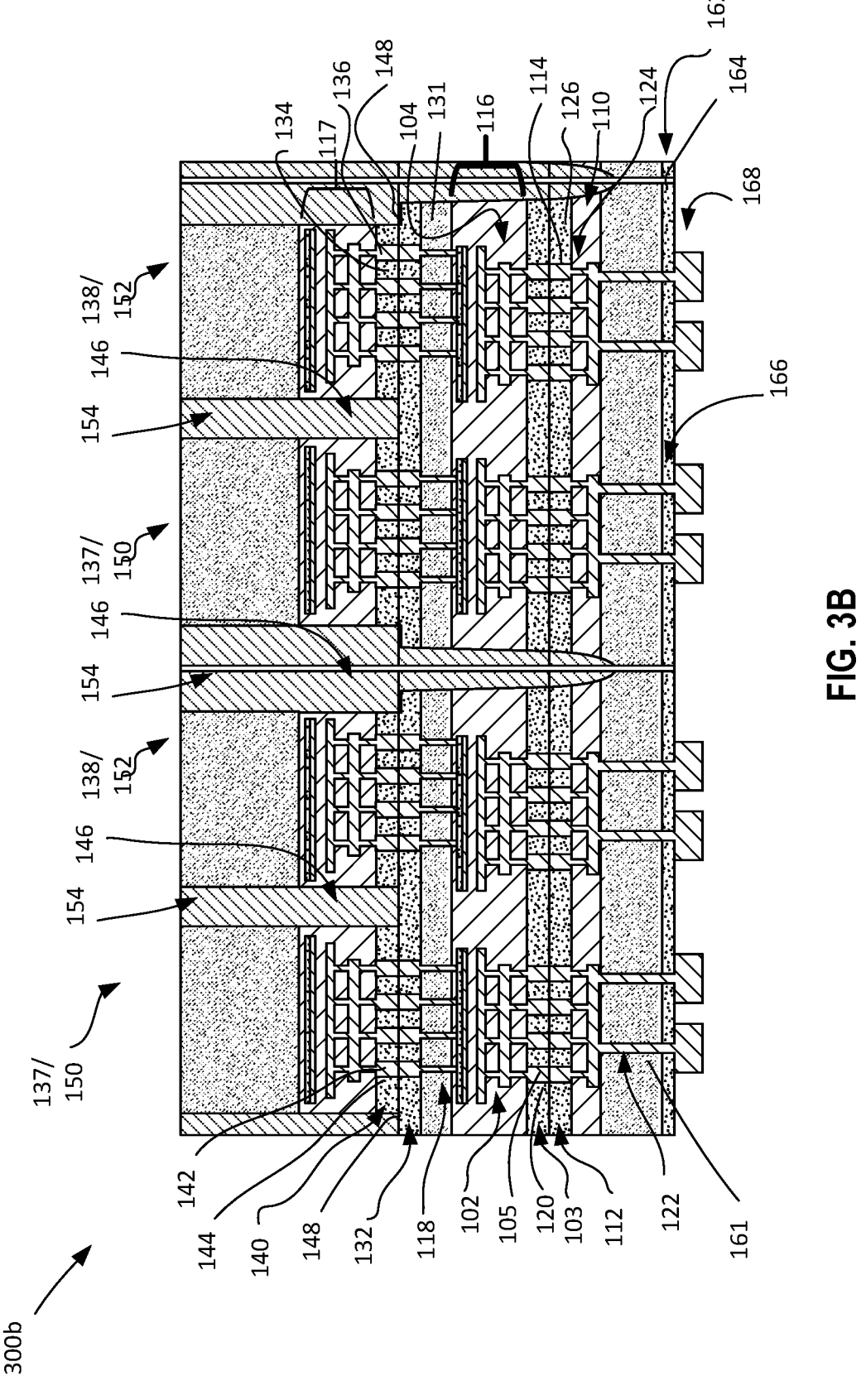
FIG. 3B is cross sectional view of the temporary microelectronic subassembly of FIG. 2D after singulation into two microelectronic subassemblies each including a stack where each row of the stack includes two dies according to the second embodiment.
Figure 3C:
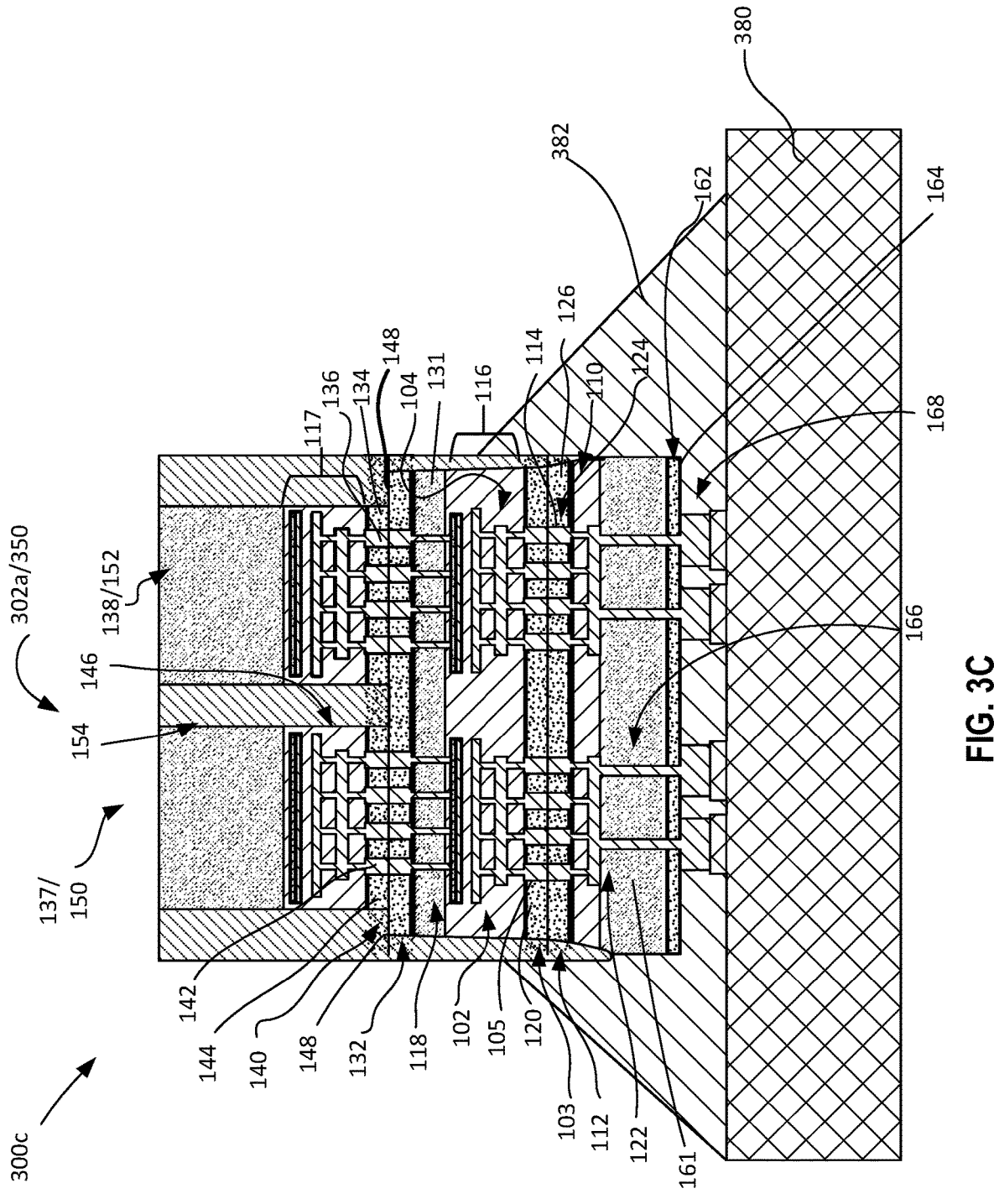
FIG. 3C is a cross sectional view of the microelectronic assembly according to the second embodiment, formed from the temporary microelectronic subassembly of FIG. 3B.

The description below relating to the material of the base wafer and interposer wafer, their thickness, the through vias therein including their dimensions and pitches, is meant to pertain equally to the base substrate and interposer substrate resulting from a singulation of the same, for example as shown in FIGS. 2E, 3B and 3C.

Preferably, the base wafer includes silicon, although it may further include glass, or a ceramic material. The base wafer may be an active wafer (include active components therein, such as transistors) or it may be a passive wafer.

Preferably, the base wafer has a thickness below 50 μm, preferably from about 5 μm to about 50 μm, for example 9 μm. Preferably, the through vias are thin through vias, for example with diameters of about 2 μm to about 10 μm. Preferably the vias are short (e.g. lengths below about 50 μm, for example about 5 μm to about 50 μm), and/or at tight pitches (e.g. submicron range to about 20 μm).

According to an embodiment, where the pitch is less than or equal to 2 μm, the through via diameter is about ½ of the pitch, and where the pitch is above 2 μm, the diameter is between about 5 μm and 10 μm.

Figures 1D, 1E:
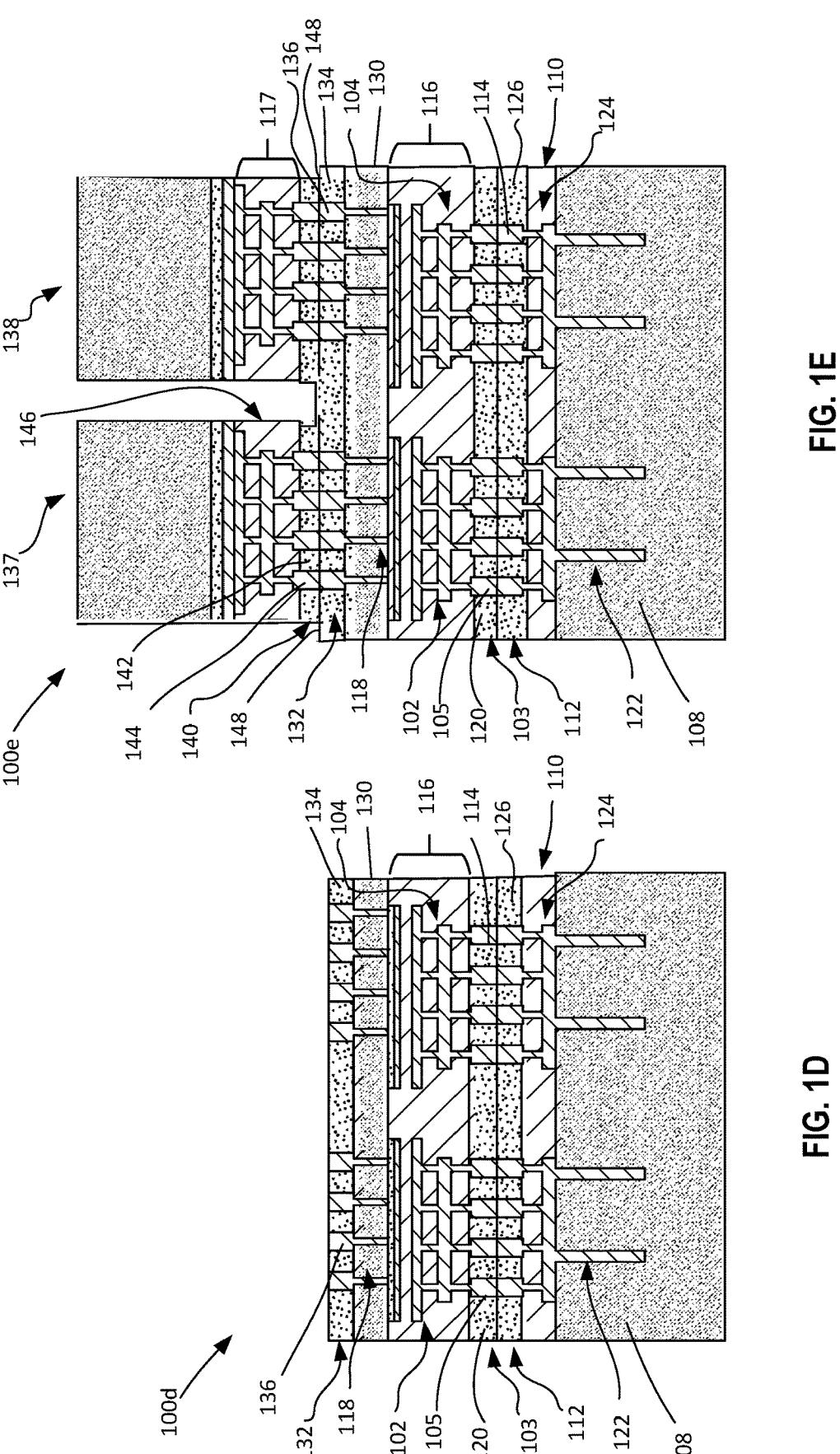
FIG. 1D is a cross-sectional view of the temporary microelectronic subassembly of FIG. 1C, after the provision of bonding layers thereon.
FIG. 1E is cross sectional view of the temporary microelectronic subassembly of FIG. 1D with dies bonded to a backside of the same.

FIG. 1D is a cross-sectional view of the temporary microelectronic subassembly 100c of FIG. 1C, after the provision of bonding layers thereon to yield a temporary microelectronic subassembly 100d. In FIG. 1D, after a reveal of the through vias 118 at the front of the base wafer 130, a bonding layer 132 is provided thereon. Bonding layer 132 includes a dielectric layer 134, and interconnects 136 embedded therein, the interconnects open toward a front surface of the TMSA 100d. The bonding layer 132 may be provided for example by depositing the dielectric layer 134, patterning the same, for example using lithography, following by provision of a seed layer and plating to create the interconnects 136.

FIG. 1E is cross sectional view of the temporary microelectronic subassembly 100d of FIG. 1D with die assemblies 137 and 138 bonded to a backside of the same to provide a temporary microelectronic subassembly 100e. Die subassemblies 137 and 138 may each comprise a bonding layer 140 including a dielectric layer 142 and interconnects 144, a die 146, along with a silicon layer, such as an active silicon layer, on a top surface of the dies 146. The die assemblies 137 and 138 may be bonded (i.e. electrically and mechanically bonded) to the underlying base wafer 130 either by way of hybrid bonding as shown, or, in the alternative, using other bonding mechanisms and structures such as solder bumps. The resulting structure 100d would be a microelectronic subassembly that presents a first layer or bottom layer 116 supported on an interposer structure 108, a base wafer 130 on a front surface of the first layer, and die assemblies 137 and 138 on a front surface of the base wafer 130, in the shown embodiments with intervening bonding layers 132 and 140. In FIG. 1E, for each die assembly 136/138, a second layer (or top layer) 117 includes bonding layer 140, and a layer including die 146.

The structure of temporary microelectronic subassembly 100d presents shelf structures 148 defined by upper edge surfaces of the bonding layer 132 not covered by the die assemblies 137 and 138. These shelf structures result from a spacing as between the die assemblies 137 and 138, and may, in some embodiments, persist after packaging, as will be explained in more detail in the context of FIGS. 2A-2E and 3A-3C below.

FIGS. 2A-2E pertain to the processing of the temporary microelectronic subassembly 100e of FIG. 1E to result in microelectronic components according to a first embodiment, where a stack of dies includes one die per stack layer (that is, one die in a first layer closest to the interposer substrate resulting from singulation of the interposer wafer (see FIG. 2E), and one die in a second layer disposed on the base substrate also resulting from singulation of the base wafer (see FIG. 2E)).

FIG. 2A is a cross section of the temporary microelectronic subassembly 100e of FIG. 1E after having been subjected to material removal in a process to form a microelectronic assembly according to a first embodiment as shown in FIG. 2E. The processing suggested in FIG. 2A results in a temporary microelectronic subassembly 200a. the TMSA 100e of FIG. 1E may be subjected to removal of material between the die assemblies 137 and 138, through the base wafer 130, between dies 102 and 104, all the way to the interposer structure 108. Optionally, a laser removal process may be used. Optionally, material removal may be implemented such that shelf structure 148 shown in FIG. 1E remains on each side of individual ones of the die assemblies 137 and 138 (now shown). Material removal would result in individual die stacks 150 and 152, supported on interposer structure 108. As noted previously, the structures shown in FIGS. 1A-1E, 2A-2E, 3A and 3B show a wafer level processing for face to back attachment, and, it is to be understood for example that, in the context of FIGS. 2A-2E for example, there could for example be 100's to thousands or more of the die on the shown wafers or wafer structures.

FIG. 2B is a cross sectional view of the temporary microelectronic subassembly 200a of FIG. 2A after a molding and thinning process to yield a temporary microelectronic subassembly 200b. Thus, in FIG. 2B, the temporary microelectronic subassembly 200a may be encapsuled in a mold compound 154. An mold compound such as an epoxy resin or silicon dioxide may be used. The mold compound 154 may, in one embodiment, as shown, extend across lateral walls of individual ones of the die assemblies from a top surface thereof all the way to the interposer structure 108. Where there exists a shelf structure 148 on each side of the individual ones of the die assemblies 137 and 138, the mold compound may encapsulate only the die assemblies 137 and 138, and not extend along sidewalls of the first layer 116 and base wafer 130. In such an example, the mold compound would be supported on the base wafer and would not extend below the same.

FIG. 2C is a cross sectional view of the temporary microelectronic subassembly 200b of FIG. 2B after a through via reveal process on the interposer structure 108 to yield a temporary microelectronic assembly 200c and to yield interposer wafer 160. In FIG. 2C, the TMSA 200b of FIG. 2B may be subjected to grinding at the front surface 158 thereof to expose or reveal through vias 122 and to form interposer wafer 160 as a result.

Preferably, the interposer wafer 160 includes silicon, although it may further include glass, or a ceramic material. The interposer wafer may be a passive wafer (not include active components therein, such as transistors) or it may be an active wafer. The interposer wafer may have a thickness from about 5 μm to about 50 μm or more. The through vias 122 may have diameters above 10 μm, and may be long (e.g. lengths above about 50 μm), and/or at wide pitches (e.g. above about 20 μm). Alternatively the through vias 122 may present dimensions and pitches similar to that of through vias 118.

According to an embodiment a ratio of a thickness of the base wafer 130 to that of the interposer wafer 160 is 2:8, 1:9 or 1:1, to name a few examples.

According to an embodiment, a combined thickness of the base wafer and interposer wafer is about 50 μm to about 100 μm.

According to an embodiment, the interposer structure 106 and resulting interposer wafer 160 together impart mechanical stability and reliability to the dies during the face to back process flow depicted in FIGS. 1A-1E, 2A-2E, and 3A-3C.

FIG. 2D is a cross-sectional view of the temporary microelectronic subassembly 200c of FIG. 2C after provision of electrically conductive structures on the interposer wafer 160 to yield a temporary microelectronic subassembly 200d. The electrically conductive structures include a bonding layer 162 including a dielectric layer 164 having interconnects 166 embedded therein, and, on the bonding layer 162, a series of bumps, such as solder bump 168. Instead of solder bumps 168, other electrically conductive structures may be used, such as gold bumps, or electrically conductive studs, to name a few examples.

FIG. 2E is cross sectional view of the temporary microelectronic subassembly 200*d* of FIG. 2D after singulation to yield two microelectronic components 200*e*' and 200*e*". The microelectronic components 200*e*' and 200*e*" each include a stack of dies electrically and mechanically coupled to one another, where the stack comprises an interposer substrate 161 formed from singulation of the interposer wafer 160 of FIG. 2D having through vias 122 therein, a first layer 116 on a front surface of the interposer substrate, the first layer 116 including one or more dies 102/104 coupled to the through vias 122 of the interposer substrate 161, a base substrate 131 on the first layer 116, the base substrate 131 including through vias 118 therein, a second layer 117 on the front surface of the base substrate 131, the second layer 117 including bonding layer 140 and one or more dies 146 coupled to the through vias 118 of the base wafer through bonding layer 140. The microelectronic component 200*e*'/ 200*e*" may then be coupled to a package substrate by way of bumps 168 and provided with underfill at the bump connection regions in a well-known manner.

FIGS. 3A-3C pertain to the processing of the temporary microelectronic subassembly 100*e* of FIG. 1E to result in microelectronic components according to a second embodiment, where a stack of dies includes two dies per stack layer (that is, two dies in a first layer closest to the interposer wafer, and two dies in a second layer disposed on the base wafer).

FIG. 3A is a cross-sectional view of a temporary microelectronic subassembly 300*a* similar to that of FIG. 2D, but with each row of a stack of dies including two dies in a process to form a microelectronic assembly according to a second embodiment. In particular, the configuration 300*a* of FIG. 3A may be provided by: (1) material removal, similar to the material removal process described above in the example of FIG. 2A; (2) applying a mold compound similar to the process described above in the example of FIG. 2B; (3) revealing through vias of the interposer structure similar to the reveal process described above in the example of FIG. 2C; and (4) the provision of electrically conductive structures on a backside of the interposer structure similar to the process described above in the example of FIG. 2D.

In order to achieve the configuration of FIG. 3A, a starting temporary microelectronic subassembly would be that of FIG. 1E (which, although shown with only two dies per layer or row, contains multiple dies per layer or row, as previously noted, given that the shown embodiments pertain to wafer level processing).

The temporary microelectronic subassembly of 100*e* (except with more dies per layer shown) may first be subjected to material removal between a first die assembly 302' and a second die assembly 302", with individual ones of the die assemblies 302' and 302" thus having, as a starting point, the TMSA 100*e* of FIG. 1E. The material removal may be implemented through the bonding layer 132, through the base wafer 130, between die 102 of the first die assembly 302' and die 104 of the second die assembly 302", all the way to the interposer structure 108. Optionally, a laser removal process may be used. Optionally, material removal may be implemented such that shelf structure 148 shown in FIG. 1E remains on each side of individual ones of the die assemblies 302' and 302". Material removal would result in individual die stacks 350 and 352, supported on interposer structure 108.

After material removal, a molding process may be carried out where the die stacks 350 and 352 are encapsuled in a mold compound 354. A mold compound such as an epoxy resin or silicon dioxide may be used. The mold compound 354 may, in one embodiment, as shown, extend across lateral walls of individual ones of the die stacks from a top surface thereof all the way to the interposer structure 108. For individual ones of the die assemblies 350 and 352, where there exists a shelf structure 148 on each side of the individual ones of the corresponding die assemblies 137 and 138, the mold compound may encapsulate only the die assemblies 137 and 138, and not extend along sidewalls of the first layer 116 and base wafer 130. In such an example, for individual ones of the die assemblies 350 and 352, the mold compound would be supported on the base wafer and would not extend below the same.

After provision of the mold compound, a via reveal process, such as by way of grinding, on the interposer structure 108 may take place to form interposer wafer 108 and to expose or reveal through vias 122.

Similar to the first embodiment as described above in relation to FIGS. 2A-2E, preferably, the interposer wafer 160 includes silicon, although it may further include glass, or a ceramic material. The interposer wafer may be a passive wafer (not include active components therein, such as transistors) or it may be an active wafer. The interposer wafer may have a thickness from about 5 μm to about 50 μm or more. The through vias 122 may have diameters above 10 μm, and may be long (e.g. lengths above about 50 μm), and/or at wide pitches (e.g. above about 20 μm). Alternatively the through vias 122 may present dimensions and pitches similar to that of through vias 118.

According to an embodiment a ratio of a thickness of the base wafer 130 to that of the interposer wafer 160 is 2:8, 1:9 or 1:1, to name a few examples.

According to an embodiment, a combined thickness of the base wafer and interposer wafer is about 50 μm to about 100 μm.

According to an embodiment, the interposer structure 106 and resulting interposer wafer 160 together impart mechanical stability and reliability to the dies during the face to back process flow depicted in FIGS. 1A-1E, 2A-2E, and 3A-3C.

After the reveal of through vias 122, electrically conductive structures may be provided on the interposer wafer 160 to yield the temporary microelectronic subassembly 300A. The electrically conductive structures include a bonding layer 162 including a dielectric layer 164 having interconnects 166 embedded therein, and, on the bonding layer 162, a series of bumps, such as solder bump 168. Instead of solder bumps 168, other electrically conductive structures may be used, such as gold bumps, or electrically conductive studs, to name a few examples.

FIG. 3B is cross sectional view of the temporary microelectronic subassembly 300*a* of FIG. 3A after singulation into two microelectronic components 300*b*' and 300*b*" similar to microelectronic components 200*e*' and 200*e*" of FIG. 2E but each including a stack where each row of the stack includes two dies according to the second embodiment. Similar to the embodiment of FIGS. 2A-2E, singulation of the microelectronic subassembly 300*a* of FIG. 3A results in microelectronic components 200*e*' and 200*e*" where the interposer wafer yields interposer substrates, and where the base wafer yields base substrates.

The presence of a shelf structure 148 allows the provision of a larger amount of mold compound within a given microelectronic component 300*b'* or 300*b''*, which can impart further mechanical strength to each component.

FIG. 3C is a cross sectional view of a microelectronic assembly 300*c* according to the second embodiment, formed from the temporary microelectronic subassembly 300*b* of FIG. 3B, after the subassembly 300*b* has been mechanically and electrically bonded to a package substrate 380 by way of bumps 168, in a well-known manner, including the provision of underfill material 382. The package substrate may include any suitable package substrate, such as an organic substrate.

Note that, while single layers may be shown for certain features in FIGS. 1A-1E, 2A-2E and 3A-3C, it is to be appreciated that such features may be made of multiple sublayers having differing compositions.

Embodiments provide a face to back process flow that obviates some of the processing of reliability risks of the prior art, such as damage to a thin, second layer of dies during processing.

Advantageously, some embodiments provide a face to back process flow where no thick fillers and chemical mechanical polishing of such fillers are needed for the base dies, where die crack risks for the second layer dies is lowered, where smaller through vias in a base wafer can be provided at fine pitches, and where a keep-out zone in the dies supported on the base wafer (dies in the second layer) can be smaller as a result of the smaller through vias and fine pitches.

Figure 4:
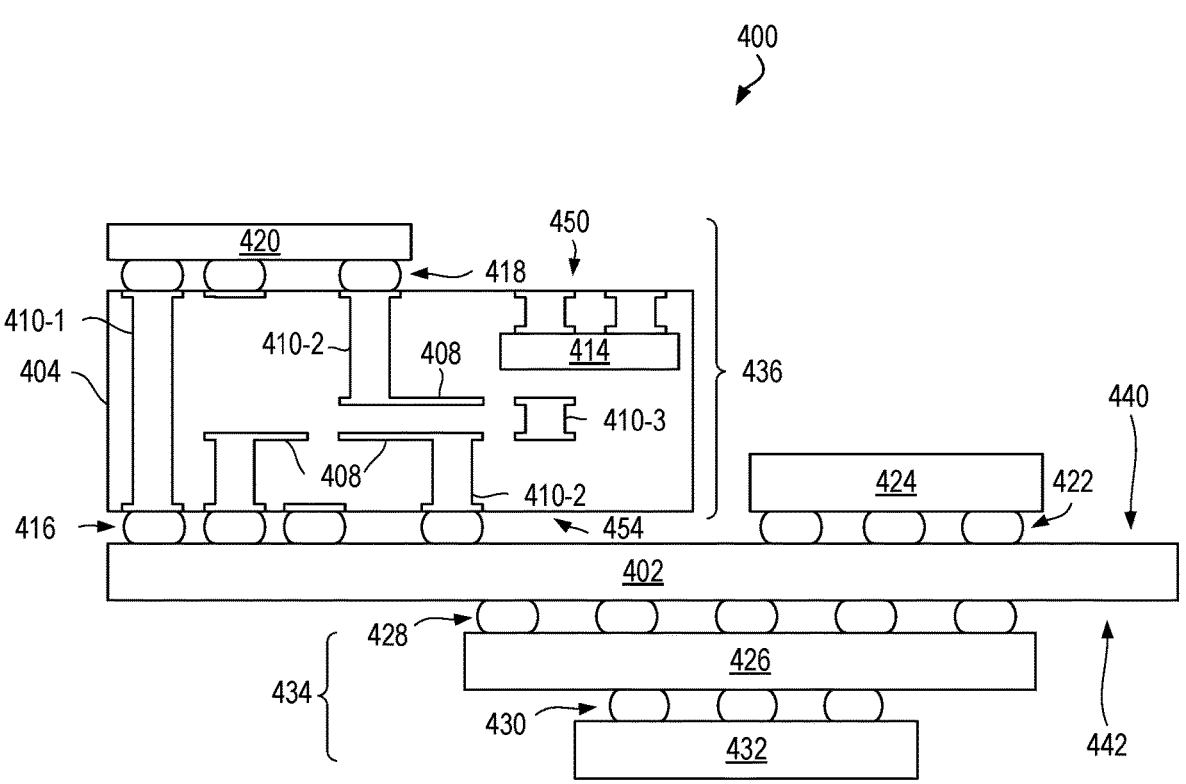
FIG. 4 is a cross-sectional side view of an integrated circuit device assembly that may include a MCP in accordance with any of the embodiments disclosed herein.

FIG. 4 is a cross-sectional side view of an integrated circuit device assembly 400 that may include one or more integrated circuit structures each including any of the microelectronic assembly embodiments described herein (e. g. microelectronic components 200*e'* or 200*e''* of FIG. 2E of microelectronic component 300*c* of FIG. 3C). The integrated circuit device assembly 400 includes a number of components disposed on a circuit board 402 (which may be a motherboard, system board, mainboard, etc.). The integrated circuit device assembly 400 includes components disposed on a first face 440 of the circuit board 402 and an opposing second face 442 of the circuit board 402; generally, components may be disposed on one or both faces 440 and 442. Any of the integrated circuit components discussed below with reference to the integrated circuit device assembly 400 may include an integrated circuit structure including a cascaded a MCP as disclosed herein.

In some embodiments, the circuit board 402 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 402. In other embodiments, the circuit board 402 may be a non-PCB substrate. The integrated circuit device assembly 400 illustrated in FIG. 4 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls (as shown in FIG. 4), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 436 may include an integrated circuit component 420 coupled to an interposer 404 by coupling components 418. The coupling components 418 may take any suitable form for the application, such as the forms discussed above with reference to the coupling components 416. Although a single integrated circuit component 420 is shown in FIG. 4, multiple integrated circuit components may be coupled to the interposer 404; indeed, additional interposers may be coupled to the interposer 404. The interposer 404 may provide an intervening substrate used to bridge the circuit board 402 and the integrated circuit component 420.

The integrated circuit component 420 may be a packaged or unpackaged integrated circuit product that includes one or more integrated circuit dies. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 420, a single monolithic integrated circuit die comprises solder bumps attached to contacts on the die. The solder bumps allow the die to be directly attached to the interposer 404. The integrated circuit component 420 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 420 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 420 comprises multiple integrated circuit dies, the dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 420 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 404 may spread connections to a wider pitch or reroute a connection to a different connection. For example, the interposer 404 may couple the integrated circuit component 420 to a set of ball grid array (BGA) conductive contacts of the coupling components 416 for coupling to the circuit board 402. In the embodiment illustrated in FIG. 4, the integrated circuit component 420 and the circuit board 402 are attached to opposing sides of the interposer 404; in other embodiments, the integrated circuit component 420 and the circuit board 402 may be attached to a same side of the interposer 404. In some embodiments, three or more components may be interconnected by way of the interposer 404.

In some embodiments, the interposer 404 may be formed as a PCB, including multiple metal layers separated from one another by layers of dielectric material and interconnected by electrically conductive vias. In some embodiments, the interposer 404 may be formed of an epoxy resin, a fiberglass-reinforced epoxy resin, an epoxy resin with inorganic fillers, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through hole vias 410-1 (that extend from a first face 450 of the interposer 404 to a second face 454 of the interposer 404), blind vias 410-2 (that extend from the first or second faces 450 or 454 of the interposer 404 to an internal metal layer), and buried vias 410-3 (that connect internal metal layers).

In some embodiments, the interposer 404 can comprise a silicon interposer. Through silicon vias (TSV) extending through the silicon interposer can connect connections on a first face of a silicon interposer to an opposing second face of the silicon interposer. In some embodiments, an interposer 404 comprising a silicon interposer can further comprise one or more routing layers to route connections on a first face of the interposer 404 to an opposing second face of the interposer 404.

The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art. In embodiments where the interposer is a non-printed circuit board The integrated circuit device assembly 400 may include an integrated circuit component 424 coupled to the first face 440 of the circuit board 402 by coupling components 422. The coupling components 422 may take the form of any of the embodiments discussed above with reference to the coupling components 416, and the integrated circuit component 424 may take the form of any of the embodiments discussed above with reference to the integrated circuit component 420.

The integrated circuit device assembly 400 illustrated in FIG. 4 includes a package-on-package structure 434 coupled to the second face 442 of the circuit board 402 by coupling components 428. The package-on-package structure 434 may include an integrated circuit component 426 and an integrated circuit component 432 coupled together by coupling components 430 such that the integrated circuit component 426 is disposed between the circuit board 402 and the integrated circuit component 432. The coupling components 428 and 430 may take the form of any of the embodiments of the coupling components 416 discussed above, and the integrated circuit components 426 and 432 may take the form of any of the embodiments of the integrated circuit component 420 discussed above. The package-on-package structure 434 may be configured in accordance with any of the package-on-package structures known in the art.

Figure 5:
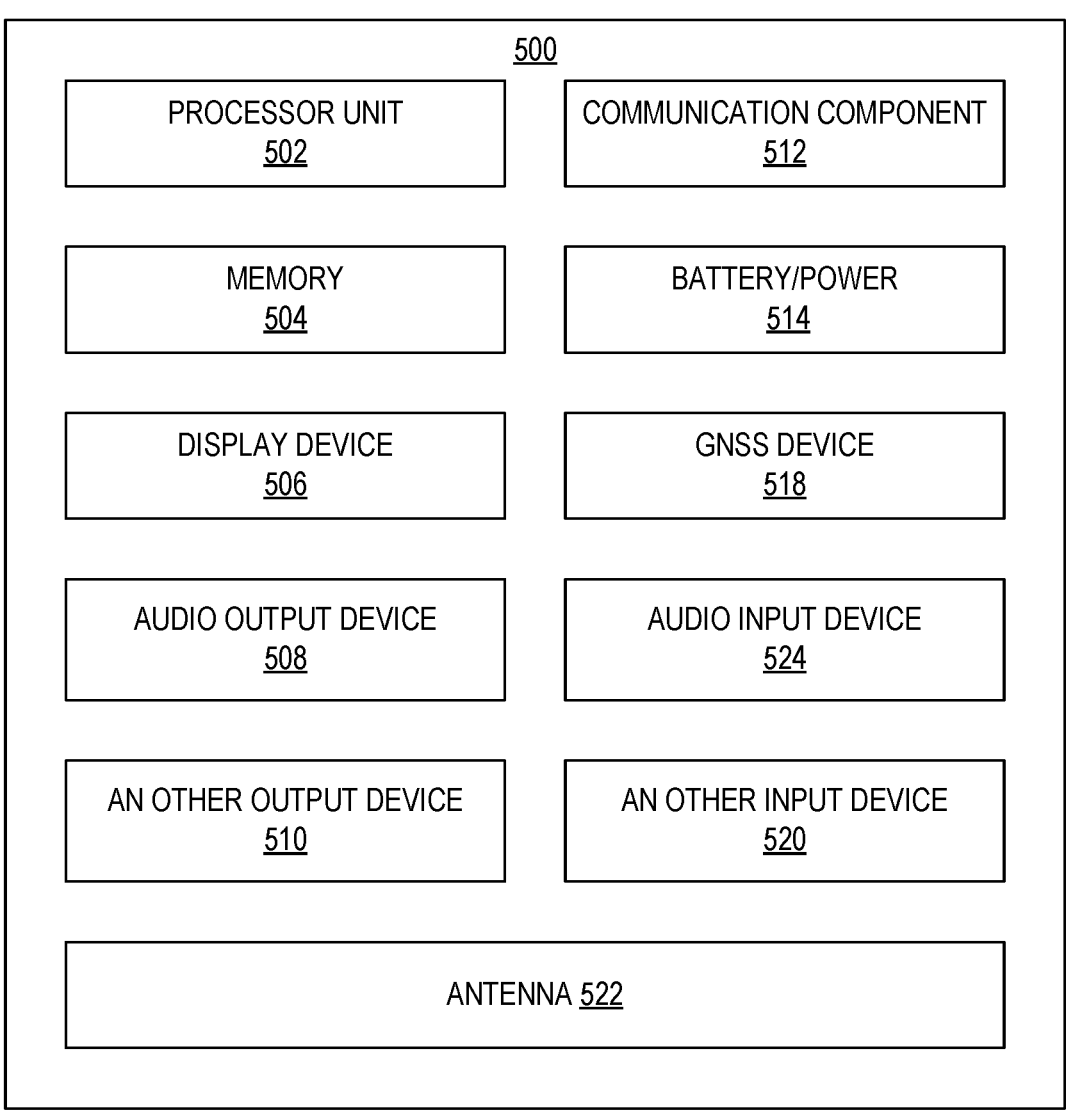
FIG. 5 is a block diagram of an example electrical device that may include a MCP assembly, in accordance with any of the embodiments disclosed herein.

FIG. 5 is a block diagram of an example electrical device 500 that may include one or more of the embodiments of a microelectronic assembly disclosed herein. For example, any suitable ones of the components of the electrical device 500 may include one or more of the integrated circuit device assemblies 400, integrated circuit components 420, and/or embodiment MCPs disclosed herein. A number of components are illustrated in FIG. 5 as included in the electrical device 500, but any one or more of these components may be omitted or duplicated, as suitable for the application. In some embodiments, some or all of the components included in the electrical device 500 may be attached to one or more motherboards mainboards, or system boards. In some embodiments, one or more of these components are fabricated onto a single system-on-a-chip (SoC) die.

Additionally, in various embodiments, the electrical device 500 may not include one or more of the components illustrated in FIG. 5, but the electrical device 500 may include interface circuitry for coupling to the one or more components. For example, the electrical device 500 may not include a display device 506, but may include display device interface circuitry (e.g., a connector and driver circuitry) to which a display device 506 may be coupled. In another set of examples, the electrical device 500 may not include an audio input device 524 or an audio output device 508, but may include audio input or output device interface circuitry (e.g., connectors and supporting circuitry) to which an audio input device 524 or audio output device 508 may be coupled.

The electrical device 500 may include one or more processor units 502 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 502 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 500 may include a memory 504, which may itself include one or more memory devices such as volatile memory (e.g., dynamic random access memory (DRAM), static random-access memory (SRAM)), nonvolatile memory (e.g., read-only memory (ROM), flash memory, chalcogenide-based phase-change non-voltage memories), solid state memory, and/or a hard drive. In some embodiments, the memory 504 may include memory that is located on the same integrated circuit die as the processor unit 502. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 500 can comprise one or more processor units 502 that are heterogeneous or asymmetric to another processor unit 502 in the electrical device 500. There can be a variety of differences between the processing units 502 in a system in terms of a spectrum of metrics of merit including architectural, micro-architectural, thermal, power consumption characteristics, and the like. These differences can effectively manifest themselves as asymmetry and heterogeneity among the processor units 502 in the electrical device 500.

In some embodiments, the electrical device 500 may include a communication component 512 (e.g., one or more communication components). For example, the communication component 512 can manage wireless communications for the transfer of data to and from the electrical device 500. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 512 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 512 may operate in accordance with other wireless protocols in other embodiments. The electrical device 500 may include one or more antennas, such as antenna 522 to facilitate wireless communications and/or to receive other wireless communications (such as AM or FM radio transmissions).

In some embodiments, the communication component 512 may manage wired communications, such as electrical, optical, or any other suitable communication protocols (e.g., IEEE 802.3 Ethernet standards). As noted above, the communication component 512 may include multiple communication components. For instance, a first communication component 512 may be dedicated to shorter-range wireless communications such as Wi-Fi or Bluetooth, and a second communication component 512 may be dedicated to longer-range wireless communications such as global positioning system (GPS), EDGE, GPRS, CDMA, WiMAX, LTE, EV- DO, or others. In some embodiments, a first communication component 512 may be dedicated to wireless communications, and a second communication component 512 may be dedicated to wired communications.

The electrical device 500 may include battery/power circuitry 514. The battery/power circuitry 514 may include one or more energy storage devices (e.g., batteries or capacitors) and/or circuitry for coupling components of the electrical device 500 to an energy source separate from the electrical device 500 (e.g., AC line power).

The electrical device 500 may include a display device 506 (or corresponding interface circuitry, as discussed above). The display device 506 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 500 may include an audio output device 508 (or corresponding interface circuitry, as discussed above). The audio output device 508 may include any embedded or wired or wirelessly connected external device that generates an audible indicator, such speakers, headsets, or earbuds.

The electrical device 500 may include an audio input device 524 (or corresponding interface circuitry, as discussed above). The audio input device 524 may include any embedded or wired or wirelessly connected device that generates a signal representative of a sound, such as microphones, microphone arrays, or digital instruments (e.g., instruments having a musical instrument digital interface (MIDI) output). The electrical device 500 may include a Global Navigation Satellite System (GNSS) device 518 (or corresponding interface circuitry, as discussed above), such as a Global Positioning System (GPS) device. The GNSS device 518 may be in communication with a satellite-based system and may determine a geolocation of the electrical device 500 based on information received from one or more GNSS satellites, as known in the art.

The electrical device 500 may include another output device 510 (or corresponding interface circuitry, as discussed above). Examples of the other output device 510 may include an audio codec, a video codec, a printer, a wired or wireless transmitter for providing information to other devices, or an additional storage device.

The electrical device 500 may include another input device 520 (or corresponding interface circuitry, as discussed above). Examples of the other input device 520 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 500 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra-mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 500 may be any other electronic device that processes data. In some embodiments, the electrical device 500 may comprise multiple discrete physical components. Given the range of devices that the electrical device 500 can be manifested as in various embodiments, in some embodiments, the electrical device 500 can be referred to as a computing device or a computing system.

FIG. 6 is a flow chart of a process 600 of making a microelectronic assembly of a semiconductor package according to some embodiments. At operation 602, the process includes providing a first microelectronic subassembly including a structure for a first wafer (first wafer structure) having first through vias therein, the first wafer structure including silicon or glass. At operation 604, the process includes providing a second microelectronic subassembly including: a structure for a second wafer (second wafer structure) including silicon or glass, the second wafer structure having second through vias therein; and a first layer on a back surface of the second wafer structure, the first layer including one or more first dies coupled to the second through vias. At operation 606, the process includes bonding the first microelectronic subassembly to the second microelectronic subassembly such that the one or more first dies are electrically coupled to the first wafer structure. At operation 608, the process includes removing a portion of the second wafer structure to yield a second wafer therefrom and to reveal the second through vias at a front surface of the second wafer. At operation 610, the process includes bonding a plurality of die assemblies to the second wafer such that dies of the die subassemblies are coupled to corresponding ones of the second through vias, the die subassemblies together defining a second layer. At operation 612, the process includes removing a portion of the first wafer structure to yield a first wafer therefrom and to reveal the first through vias at a back surface of the first wafer. At operation 614, the process includes providing electrically conductive structures coupled to the first through vias at the back surface of the first wafer to result in a microelectronic assembly including the first wafer the first layer, the second wafer and the die assemblies. At operation 616, the process includes singulating through the microelectronic assembly in a direction from the die assemblies through the first wafer to yield a plurality microelectronic components.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of embodiments has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

In embodiments, the phrase "A is located on B" means that at least a part of A is in direct physical contact or indirect physical contact (having one or more other features between A and B) with at least a part of B.

In the instant description, "A is adjacent to B" means that at least part of A is in direct physical contact with at least a part of B.

In the instant description, "B is between A and C" means that at least part of B is in or along a space separating A and C and that the at least part of B is in direct or indirect physical contact with A and C.

In the instant description, "A is attached to B" means that at least part of A is mechanically attached to at least part of B, either directly or indirectly (having one or more other features between A and B).

The use of reference numerals separated by a "/", such as "102/104" for example, is intended to refer to 102 or 104 as appropriate. Otherwise, the forward slash ("/") as used herein means "and/or."

The use of the techniques and structures provided herein can be detected using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, such tools can indicate an integrated circuit including at least one MCP including an interposer bonded to a MCP subassembly through direct dielectric-to-dielectric bonding as described herein.

In some embodiments, the techniques, processes and/or methods described herein can be detected based on the structures formed therefrom. In addition, in some embodiments, the techniques and structures described herein can be detected based on the benefits derived therefrom. Numerous configurations and variations will be apparent in light of this disclosure.

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "according to some embodiments," "in accordance with embodiments," or "in embodiments," which may each refer to one or more of the same or different embodiments. Furthermore, the terms "comprising," "including," "having," and the like, as used with respect to embodiments of the present disclosure, are synonymous.

"Coupled" as used herein means that two or more elements are in direct physical contact, or that that two or more elements indirectly physically contact each other, but yet still cooperate or interact with each other (i.e. one or more other elements are coupled or connected between the elements that are said to be coupled with each other). The term "directly coupled" means that two or more elements are in direct contact.

As used herein, the term "module" refers to being part of, or including an ASIC, an electronic circuit, a system on a chip, a processor (shared, dedicated, or group), a solid state device, a memory (shared, dedicated, or group) that execute one or more software or firmware programs, a combinational logic circuit, and/or other suitable components that provide the described functionality.

As used herein, "electrically conductive" in some examples may refer to a property of a material having an electrical conductivity greater than or equal to $10^7$ Siemens per meter (S/m) at 20 degrees Celsius. Examples of such materials include Cu, Ag, Al, Au, W, Zn and Ni.

As used herein, an "integrated circuit structure" may include one or more microelectronic dies.

In the corresponding drawings of the embodiments, signals, currents, electrical biases, or magnetic or electrical polarities may be represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, polarity, current, voltage, etc., as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the elements that are connected, without any intermediary devices. The term "coupled" means a direct or indirect connection, such as a direct electrical, mechanical, or magnetic connection between the elements that are connected or an indirect connection, through one or more passive or active intermediary devices. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., nMOS, NPN BJT, etc.) and the term "MP" indicates a p-type transistor (e.g., pMOS, PNP BJT, etc.).

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

EXAMPLES

Some non-limiting example embodiments are set forth below.

Example 1 includes a microelectronic component including: a first substrate having first through vias therein, the first substrate including silicon or glass; a first layer on a front surface of the first substrate, the first layer including one or more first dies coupled to the first through vias; a second substrate on a front surface of first layer, the second substrate having second through vias therein and including silicon or glass; a second layer on a front surface of the second substrate such that the first layer is between the first substrate and the second substrate, the second layer including one or more second dies coupled to the second through vias; and electrically conductive structures on a back surface of the first substrate, the electrically conductive structures coupled to the first through vias.

Example 2 includes the subject matter of Example 1, wherein at least one of the one or more first dies, and at least one of the one or more second dies includes a chiplet.

Example 3 includes the subject matter of Example 1, wherein the first layer is a passive layer, and the second layer is an active layer.

Example 4 includes the subject matter of Example 1, wherein a number of the one or more dies of the first layer is a same as a number of the one or more dies of the second layer.

Example 5 includes the subject matter of Example 1, wherein the second substrate has a thickness from about 5 μm to about 50 um, and wherein the second through vias have diameters of about 2 μm to about 10 μm and lengths from about 5 μm to about 50 μm.

Example 6 includes the subject matter of Example 1, wherein the second through vias have pitches from a submicron range to about 20 μm.

Example 7 includes the subject matter of Example 6, wherein, where the pitches are less than or equal to 2 μm, the second through vias have diameter of about ½ of the pitch, and where the pitches are above 2 μm, the second through vias have diameters between about 5 μm and 10 μm.

Example 8 includes the subject matter of Example 1, further including: a first interconnect layer including a first dielectric material and first interconnects embedded in the first dielectric material, the first interconnect layer between the first substrate and the first layer, wherein the first interconnects are coupled to the first through vias on a back surface of the first interconnect layer, and to the one or more first dies at a front surface of the first interconnect layer; and a second interconnect layer including a second dielectric material and second interconnects embedded in the second dielectric material, the second interconnect layer between the second substrate and the second layer, wherein the second interconnects are coupled to the second through vias on a back surface of the second interconnect layer, and to the one or more second dies at a front surface of the second interconnect layer.

Example 9 includes the subject matter of Example 8, further including a redistribution layer between the first substrate and the first interconnect layer, the redistribution layer including a third dielectric material and electrically conductive traces therein to reroute electrical pathways between a front surface and a back surface of the redistribution layer, the electrically conductive traces coupled to the first through vias the front surface of the redistribution layer, and to the first interconnects at the back surface of the redistribution layer.

Example 10 includes the subject matter of Example 8, wherein at least one of the one or more first dies is coupled to the first interconnect layer by way of hybrid bonded connections.

Example 11 includes the subject matter of Example 8, wherein at least one of the one or more second dies is coupled to the second interconnect layer by way of hybrid bonded connections.

Example 12 includes the subject matter of Example 1, further including a mold compound on the second substrate such that it encapsulates the second layer, the mold compound extending along side walls of the second layer, and extending between the one or more dies of the second layer.

Example 13 includes the subject matter of Example 12, wherein the mold compound further extends along side walls of the second substrate, along side walls of the first layer, and does not extend between the one or more dies of the first layer.

Example 14 includes the subject matter of Example 12, wherein the mold compound includes one of an epoxy material or silicon dioxide.

Example 15 includes the subject matter of Example 8, wherein a the second interconnect layer has a front surface that defines a shelf structure at areas thereof not covered by the second layer.

Example 16 includes a semiconductor package, including: a package substrate; and a microelectronic component coupled to the package substrate, the microelectronic component including: a first substrate having first through vias therein, the first substrate including silicon or glass; a first layer on a front surface of the first substrate, the first layer including one or more first dies coupled to the first through vias; a second substrate on a front surface of first layer, the second substrate having second through vias therein and including silicon or glass; a second layer on a front surface of the second substrate such that the first layer is between the first substrate and the second substrate, the second layer including one or more second dies coupled to the second through vias; and electrically conductive structures on a back surface of the first substrate, the electrically conductive structures coupled to the first through vias at one side thereof, and to the package substrate at another side thereof.

Example 17 includes the subject matter of Example 16, further including an underfill material encapsulating the electrically conductive structures.

Example 18 includes the subject matter of Example 16, wherein at least one of the one or more first dies, and at least one of the one or more second dies includes a chiplet.

Example 19 includes the subject matter of Example 16, wherein the first layer is a passive layer, and the second layer is an active layer.

Example 20 includes the subject matter of Example 16, wherein a number of the one or more dies of the first layer is a same as a number of the one or more dies of the second layer.

Example 21 includes the subject matter of Example 16, wherein the second substrate has a thickness from about 5 μm to about 50 um, and wherein the second through vias have diameters of about 2 μm to about 10 μm and lengths from about 5 μm to about 50 μm.

Example 22 includes the subject matter of Example 16, wherein the second through vias have pitches from a submicron range to about 20 μm.

Example 23 includes the subject matter of Example 22, wherein, where the pitches are less than or equal to 2 μm, the second through vias have diameter of about ½ of the pitch, and where the pitches are above 2 μm, the second through vias have diameters between about 5 μm and 10 μm.

Example 24 includes the subject matter of Example 16, further including: a first interconnect layer including a first dielectric material and first interconnects embedded in the first dielectric material, the first interconnect layer between the first substrate and the first layer, wherein the first interconnects are coupled to the first through vias on a back surface of the first interconnect layer, and to the one or more first dies at a front surface of the first interconnect layer; and a second interconnect layer including a second dielectric material and second interconnects embedded in the second dielectric material, the second interconnect layer between the second substrate and the second layer, wherein the second interconnects are coupled to the second through vias on a back surface of the second interconnect layer, and to the one or more second dies at a front surface of the second interconnect layer.

Example 25 includes the subject matter of Example 24, further including a redistribution layer between the first substrate and the first interconnect layer, the redistribution layer including a third dielectric material and electrically conductive traces therein to reroute electrical pathways between a front surface and a back surface of the redistribution layer, the electrically conductive traces coupled to the first through vias the front surface of the redistribution layer, and to the first interconnects at the back surface of the redistribution layer.

Example 26 includes the subject matter of Example 24, wherein at least one of the one or more first dies is coupled to the first interconnect layer by way of hybrid bonded connections.

Example 27 includes the subject matter of Example 24, wherein at least one of the one or more second dies is coupled to the second interconnect layer by way of hybrid bonded connections.

Example 28 includes the subject matter of Example 16, further including a mold compound on the second substrate such that it encapsulates the second layer, the mold compound extending along side walls of the second layer, and extending between the one or more dies of the second layer.

Example 29 includes the subject matter of Example 28, wherein the mold compound further extends along side walls of the second substrate, along side walls of the first layer, and does not extend between the one or more dies of the first layer.

Example 30 includes the subject matter of Example 28, wherein the mold compound includes one of an epoxy material or silicon dioxide.

Example 31 includes the subject matter of Example 24, wherein a the second interconnect layer has a front surface that defines a shelf structure at areas thereof not covered by the second layer.

Example 32 includes an integrated circuit (IC) device assembly, including: a printed circuit board; and a plurality of integrated circuit components coupled to the printed circuit board, individual ones of the integrated circuit components including one or more semiconductor packages, individual ones of the semiconductor packages including: a package substrate; and a microelectronic component coupled to the package substrate, the microelectronic component including: a first substrate having first through vias therein, the first substrate including silicon or glass; a first layer on a front surface of the first substrate, the first layer including one or more first dies coupled to the first through vias; a second substrate on a front surface of first layer, the second substrate having second through vias therein and including silicon or glass; a second layer on a front surface of the second substrate such that the first layer is between the first substrate and the second substrate, the second layer including one or more second dies coupled to the second through vias; and electrically conductive structures on a back surface of the first substrate, the electrically conductive structures coupled to the first through vias at one side thereof, and to the package substrate at another side thereof.

Example 33 includes the subject matter of Example 32, further including an underfill material encapsulating the electrically conductive structures.

Example 34 includes the subject matter of Example 32, wherein at least one of the one or more first dies, and at least one of the one or more second dies includes a chiplet.

Example 35 includes the subject matter of Example 32, wherein the first layer is a passive layer, and the second layer is an active layer.

Example 36 includes the subject matter of Example 32, wherein a number of the one or more dies of the first layer is a same as a number of the one or more dies of the second layer.

Example 37 includes the subject matter of Example 32, wherein the second substrate has a thickness from about 5 $\mu$m to about 50 um, and wherein the second through vias have diameters of about 2 $\mu$m to about 10 $\mu$m and lengths from about 5 $\mu$m to about 50 $\mu$m.

Example 38 includes the subject matter of Example 32, wherein the second through vias have pitches from a submicron range to about 20 $\mu$m.

Example 39 includes the subject matter of Example 38, wherein, where the pitches are less than or equal to 2 $\mu$m, the second through vias have diameter of about ½ of the pitch, and where the pitches are above 2 $\mu$m, the second through vias have diameters between about 5 $\mu$m and 10 $\mu$m.

Example 40 includes the subject matter of Example 32, further including: a first interconnect layer including a first dielectric material and first interconnects embedded in the first dielectric material, the first interconnect layer between the first substrate and the first layer, wherein the first interconnects are coupled to the first through vias on a back surface of the first interconnect layer, and to the one or more first dies at a front surface of the first interconnect layer; and a second interconnect layer including a second dielectric material and second interconnects embedded in the second dielectric material, the second interconnect layer between the second substrate and the second layer, wherein the second interconnects are coupled to the second through vias on a back surface of the second interconnect layer, and to the one or more second dies at a front surface of the second interconnect layer.

Example 41 includes the subject matter of Example 40, further including a redistribution layer between the first substrate and the first interconnect layer, the redistribution layer including a third dielectric material and electrically conductive traces therein to reroute electrical pathways between a front surface and a back surface of the redistribution layer, the electrically conductive traces coupled to the first through vias the front surface of the redistribution layer, and to the first interconnects at the back surface of the redistribution layer.

Example 42 includes the subject matter of Example 40, wherein at least one of the one or more first dies is coupled to the first interconnect layer by way of hybrid bonded connections.

Example 43 includes the subject matter of Example 40, wherein at least one of the one or more second dies is coupled to the second interconnect layer by way of hybrid bonded connections.

Example 44 includes the subject matter of Example 32, further including a mold compound on the second substrate such that it encapsulates the second layer, the mold compound extending along side walls of the second layer, and extending between the one or more dies of the second layer.

Example 45 includes the subject matter of Example 44, wherein the mold compound further extends along side walls of the second substrate, along side walls of the first layer, and does not extend between the one or more dies of the first layer.

Example 46 includes the subject matter of Example 44, wherein the mold compound includes one of an epoxy material or silicon dioxide.

Example 47 includes the subject matter of Example 40, wherein a the second interconnect layer has a front surface that defines a shelf structure at areas thereof not covered by the second layer.

Example 48 includes a method to form a microelectronic structure of a semiconductor package, the method including: providing a first microelectronic subassembly including a structure for a first wafer (first wafer structure) having first through vias therein, the first wafer structure including silicon or glass; providing a second microelectronic subassembly including: a structure for a second wafer (second wafer structure) including silicon or glass, the second wafer structure having second through vias therein; and a first layer on a back surface of the second wafer structure, the first layer including one or more first dies coupled to the second through vias; bonding the first microelectronic subassembly to the second microelectronic subassembly such that the one or more first dies are electrically coupled to the first wafer structure; removing a portion of the second wafer structure to yield a second wafer therefrom and to reveal the second through vias at a front surface of the second wafer; bonding a plurality of die assemblies to the second wafer such that dies of the die subassemblies are coupled to corresponding ones of the second through vias, the die subassemblies together defining a second layer; removing a portion of the first wafer structure to yield a first wafer therefrom and to reveal the first through vias at a back surface of the first wafer; providing electrically conductive structures coupled to the first through vias at the back surface of the first wafer to result in a microelectronic assembly including the first wafer the first layer, the second wafer and the die assemblies; and singulating through the microelectronic assembly in a direction from the die assemblies through the first wafer to yield a plurality microelectronic components, wherein individual ones of the first wafer and the second wafer yield, respectively, a plurality of first wafer and second wafers from singulation.

Example 49 includes the subject matter of Example 48, wherein at least one of the one or more first dies, and at least one of the one or more second dies includes a chiplet.

Example 50 includes the subject matter of Example 48, wherein the first layer is a passive layer, and the second layer is an active layer.

Example 51 includes the subject matter of Example 48, wherein, for individual ones of the microelectronic components, a number of the one or more dies of the first layer is a same as a number of the one or more dies of the second layer.

Example 52 includes the subject matter of Example 48, wherein the second wafer has a thickness from about 5 µm to about 50 um, and wherein the second through vias have diameters of about 2 µm to about 10 µm and lengths from about 5 µm to about 50 µm.

Example 53 includes the subject matter of Example 48, wherein the second through vias have pitches from a submicron range to about 20 µm.

Example 54 includes the subject matter of Example 53, wherein, where the pitches are less than or equal to 2 µm, the second through vias have diameter of about ½ of the pitch, and where the pitches are above 2 µm, the second through vias have diameters between about 5 µm and 10 µm.

Example 55 includes the subject matter of Example 48, further including: providing, on the first wafer structure, and prior to bonding the first microelectronic subassembly to the second microelectronic subassembly, a first interconnect layer including a first dielectric material and first interconnects embedded in the first dielectric material, wherein bonding the first microelectronic subassembly to the second microelectronic subassembly includes bonding such that the first interconnects are coupled to the first through vias on a back surface of the first interconnect layer, and to the one or more first dies of the first layer at a front surface of the first interconnect layer; and providing, on the second wafer, and prior to bonding the die assemblies to the second wafer, a second interconnect layer including a second dielectric material and second interconnects embedded in the second dielectric material, wherein bonding the die assemblies to the second wafer includes bonding such that the second interconnects are coupled to dies of the die assemblies at a front surface of the second interconnect layer.

Example 56 includes the subject matter of Example 55, the first microelectronic subassembly further includes a redistribution layer between the first wafer structure and the first interconnect layer, the redistribution layer including a third dielectric material and electrically conductive traces therein to reroute electrical pathways between a front surface and a back surface of the redistribution layer, the electrically conductive traces coupled to the first through vias the front surface of the redistribution layer, and to the first interconnects at the back surface of the redistribution layer.

Example 57 includes the subject matter of Example 55, wherein bonding the first microelectronic subassembly to the second microelectronic subassembly includes bonding such that the first interconnects are coupled to the one or more dies of the first layer at a front surface of the first interconnect layer by way of hybrid bonded connections.

Example 58 includes the subject matter of Example 55, wherein bonding the plurality of die subassemblies to the second wafer includes bonding such that the second interconnects are coupled to dies of the die subassemblies by way of hybrid bonded connections.

Example 59 includes the subject matter of Example 48, further including providing a mold compound on the second wafer such that it encapsulates the second layer, the mold compound extending along side walls of the second layer, and extending between the one or more dies of the second layer.

Example 60 includes the subject matter of Example 59, wherein the mold compound further extends along side walls of the second wafer, along side walls of the first layer, and does not extend between the one or more dies of the first layer.

Example 61 includes the subject matter of Example 59, wherein the mold compound includes one of an epoxy material or silicon dioxide.

Example 62 includes the subject matter of Example 55, wherein a the second interconnect layer has a front surface that defines a shelf structure at areas thereof not covered by the second layer.

What is claimed is:

1. A microelectronic component including:
a first substrate having first through vias therein, the first substrate including silicon or glass;
a first layer on a front surface of the first substrate, the first layer including one or more first dies coupled to the first through vias;
a second substrate on a front surface of first layer, the second substrate having second through vias therein and including silicon or glass;
a second layer on a front surface of the second substrate such that the first layer is between the first substrate and the second substrate, the second layer including one or more second dies coupled to the second through vias; and
electrically conductive structures on a back surface of the first substrate, the electrically conductive structures coupled to the first through vias, wherein at least one of:
the second through vias have a pitch less than or equal to 2 μm and a diameter that is about ½ of the pitch; or
the pitch is above 2 μm, the diameter is between about 5 μm and 10 μm.

2. The microelectronic component of claim 1, wherein at least one of the one or more first dies, and at least one of the one or more second dies includes a chiplet.

3. The microelectronic component of claim 1, wherein the first layer is a passive layer, and the second layer is an active layer.

4. The microelectronic component of claim 1, wherein a number of the one or more dies of the first layer is a same as a number of the one or more dies of the second layer.

5. The microelectronic component of claim 1, wherein the second substrate has a thickness from about 5 μm to about 50 um, wherein the second through vias have diameters of about 2 μm to about 10 μm and lengths from about 5 μm to about 50 μm, wherein the second through vias have pitches from a submicron range to about 20 μm.

6. The microelectronic component of claim 1, further including:
a first interconnect layer including a first dielectric material and first interconnects embedded in the first dielectric material, the first interconnect layer between the first substrate and the first layer, wherein the first interconnects are coupled to the first through vias on a back surface of the first interconnect layer, and to the one or more first dies at a front surface of the first interconnect layer; and a second interconnect layer including a second dielectric material and second interconnects embedded in the second dielectric material, the second interconnect layer between the second substrate and the second layer, wherein the second interconnects are coupled to the second through vias on a back surface of the second interconnect layer, and to the one or more second dies at a front surface of the second interconnect layer.

7. The microelectronic component of claim 6, further including a redistribution layer between the first substrate and the first interconnect layer, the redistribution layer including a third dielectric material and electrically conductive traces therein to reroute electrical pathways between a front surface and a back surface of the redistribution layer, the electrically conductive traces coupled to the first through vias the front surface of the redistribution layer, and to the first interconnects at the back surface of the redistribution layer.

8. The microelectronic component of claim 6, wherein at least one of the one or more first dies is coupled to the first interconnect layer by way of hybrid bonded connections.

9. The microelectronic component of claim 6, wherein the second interconnect layer has a front surface that defines a shelf structure at areas thereof not covered by the second layer.

10. The microelectronic component of claim 1, further including a mold compound on the second substrate such that it encapsulates the second layer, the mold compound extending along side walls of the second layer, and extending between the one or more dies of the second layer.

11. The microelectronic component of claim 10, wherein the mold compound further extends along side walls of the second substrate, along side walls of the first layer.

12. A semiconductor package, including:
a package substrate; and
a microelectronic component coupled to the package substrate, the microelectronic component including:
a first substrate having first through vias therein, the first substrate including silicon or glass;
a first layer on a front surface of the first substrate, the first layer including one or more first dies coupled to the first through vias;
a second substrate on a front surface of first layer, the second substrate having second through vias therein and including silicon or glass;
a second layer on a front surface of the second substrate such that the first layer is between the first substrate and the second substrate, the second layer including one or more second dies coupled to the second through vias; and
electrically conductive structures on a back surface of the first substrate, the electrically conductive structures coupled to the first through vias at one side thereof, and to the package substrate at another side thereof, wherein at least one of:
the second through vias have a pitch less than or equal to 2 μm and a diameter that is about ½ of the pitch; or
the pitch is above 2 μm, the diameter is between about 5 μm and 10 μm.

13. The semiconductor package of claim 12, further including an underfill material encapsulating the electrically conductive structures.

14. The semiconductor package of claim 12, wherein at least one of the one or more first dies, and at least one of the one or more second dies includes a chiplet.

15. The semiconductor package of claim 12, wherein the first layer is a passive layer, and the second layer is an active layer.

16. The semiconductor package of claim 12 further including:

a first interconnect layer including a first dielectric material and first interconnects embedded in the first dielectric material, the first interconnect layer between the first substrate and the first layer, wherein the first interconnects are coupled to the first through vias on a back surface of the first interconnect layer, and to the one or more first dies at a front surface of the first interconnect layer; and a second interconnect layer including a second dielectric material and second interconnects embedded in the second dielectric material, the second interconnect layer between the second substrate and the second layer, wherein the second interconnects are coupled to the second through vias on a back surface of the second interconnect layer, and to the one or more second dies at a front surface of the second interconnect layer.

17. The semiconductor package of claim 16, further including a redistribution layer between the first substrate and the first interconnect layer, the redistribution layer including a third dielectric material and electrically conductive traces therein to reroute electrical pathways between a front surface and a back surface of the redistribution layer, the electrically conductive traces coupled to the first through vias the front surface of the redistribution layer, and to the first interconnects at the back surface of the redistribution layer.

18. The semiconductor package of claim 16, wherein at least one of the one or more first dies is coupled to the first interconnect layer by way of hybrid bonded connections.

19. The semiconductor package of claim 12 further including a mold compound on the second substrate such that it encapsulates the second layer, the mold compound extending along side walls of the second layer, and extending between the one or more dies of the second layer.

20. An integrated circuit (IC) device assembly, including:

a printed circuit board; and a plurality of integrated circuit components coupled to the printed circuit board, individual ones of the integrated circuit components including one or more semiconductor packages, individual ones of the semiconductor packages including:

a package substrate; and a microelectronic component coupled to the package substrate, the microelectronic component including:

a first substrate having first through vias therein, the first substrate including silicon or glass;

a first layer on a front surface of the first substrate, the first layer including one or more first dies coupled to the first through vias;

a second substrate on a front surface of first layer, the second substrate having second through vias therein and including silicon or glass;

a second layer on a front surface of the second substrate such that the first layer is between the first substrate and the second substrate, the second layer including one or more second dies coupled to the second through vias; and electrically conductive structures on a back surface of the first substrate, the electrically conductive structures coupled to the first through vias at one side thereof, and to the package substrate at another side thereof wherein at least one of: the second through vias have a pitch less than or equal to 2 um and a diameter that is about of the pitch; or the pitch is above 2 pm, the diameter is between about 5 um and 10 um .

21. The IC device assembly of claim 20, wherein the second substrate has a thickness from about 5 μm to about 50 um, wherein the second through vias have diameters of about 2 μm to about 10 μm and lengths from about 5 μm to about 50 μm, and wherein the second through vias have pitches from a submicron range to about 20 μm.

22. The IC device assembly of claim 20, further including:

a first interconnect layer including a first dielectric material and first interconnects embedded in the first dielectric material, the first interconnect layer between the first substrate and the first layer, wherein the first interconnects are coupled to the first through vias on a back surface of the first interconnect layer, and to the one or more first dies at a front surface of the first interconnect layer; and a second interconnect layer including a second dielectric material and second interconnects embedded in the second dielectric material, the second interconnect layer between the second substrate and the second layer, wherein the second interconnects are coupled to the second through vias on a back surface of the second interconnect layer, and to the one or more second dies at a front surface of the second interconnect layer.

23. The IC device assembly of claim 22, wherein at least one of the one or more first dies is coupled to the first interconnect layer by way of hybrid bonded connections.

24. A method to form a microelectronic structure of a semiconductor package, the method including:

providing a first microelectronic subassembly including a structure for a first wafer (first wafer structure) having first through vias therein, the first wafer structure including silicon or glass;

providing a second microelectronic subassembly including:

a structure for a second wafer (second wafer structure) including silicon or glass, the second wafer structure having second through vias therein; and a first layer on a back surface of the second wafer structure, the first layer including one or more first dies coupled to the second through vias;

bonding the first microelectronic subassembly to the second microelectronic subassembly such that the one or more first dies are electrically coupled to the first wafer structure;

removing a portion of the second wafer structure to yield a second wafer therefrom and to reveal the second through vias at a front surface of the second wafer;

bonding a plurality of die assemblies to the second wafer such that dies of the die subassemblies are coupled to corresponding ones of the second through vias, the die subassemblies together defining a second layer;

removing a portion of the first wafer structure to yield a first wafer therefrom and to reveal the first through vias at a back surface of the first wafer;

providing electrically conductive structures coupled to the first through vias at the back surface of the first wafer to result in a microelectronic assembly including the first wafer the first layer, the second wafer and the die assemblies; and singulating through the microelectronic assembly in a direction from the die assemblies through the first wafer to yield a plurality microelectronic components, wherein individual ones of the first wafer and the second wafer yield, respectively, a plurality of first wafer and second wafers from singulation.

25. The method of claim 24, wherein the second wafer has a thickness from about 5 µm to about 50 um, wherein the second through vias have diameters of about 2 µm to about 10 µm and lengths from about 5 µm to about 50 µm, and wherein the second through vias have pitches from a sub-micron range to about 20 µm.

26. The method of claim 24, further including:

providing, on the first wafer structure, and prior to bond-ing the first microelectronic subassembly to the second microelectronic subassembly, a first interconnect layer including a first dielectric material and first intercon-nects embedded in the first dielectric material, wherein bonding the first microelectronic subassembly to the second microelectronic subassembly includes bonding such that the first interconnects are coupled to the first through vias on a back surface of the first interconnect layer, and to the one or more first dies of the first layer at a front surface of the first interconnect layer; and providing, on the second wafer, and prior to bonding the die assemblies to the second wafer, a second intercon-nect layer including a second dielectric material and second interconnects embedded in the second dielectric material, wherein bonding the die assemblies to the second wafer includes bonding such that the second interconnects are coupled to dies of the die assemblies at a front surface of the second interconnect layer.

27. The method of claim 26, the first microelectronic subassembly further includes a redistribution layer between the first wafer structure and the first interconnect layer, the redistribution layer including a third dielectric material and electrically conductive traces therein to reroute electrical pathways between a front surface and a back surface of the redistribution layer, the electrically conductive traces coupled to the first through vias the front surface of the redistribution layer, and to the first interconnects at the back surface of the redistribution layer.

28. The method of claim 26, wherein bonding the first microelectronic subassembly to the second microelectronic subassembly includes bonding such that the first intercon-nects are coupled to the one or more dies of the first layer at a front surface of the first interconnect layer by way of hybrid bonded connections.

29. The method of claim 26, further including providing a mold compound on the second wafer such that it encap-sulates the second layer, the mold compound extending along side walls of the second layer, and extending between the one or more dies of the second layer, wherein:

the mold compound further extends along side walls of the second wafer, along side walls of the first layer, and does not extend between the one or more dies of the first layer; and wherein the mold compound includes one of an epoxy material or silicon dioxide.

30. The microelectronic component of claim 1, wherein the second substrate has a thickness from about 5 µm to about 50 um, wherein the second through vias have diam-eters of about 2 µm to about 10 µm and lengths from about 5 µm to about 50 µm, wherein the second through vias have pitches from a submicron range to about 20 µm.

* * * * *